United States Patent
Ema et al.

(10) Patent No.: US 7,723,825 B2
(45) Date of Patent: May 25, 2010

(54) SEMICONDUCTOR DEVICE AND METHOD OF MANUFACTURING THE SAME

(75) Inventors: Taiji Ema, Kawasaki (JP); Masayoshi Asano, Kawasaki (JP); Toru Anezaki, Kawasaki (JP); Junichi Ariyoshi, Kawasaki (JP)

(73) Assignee: Fujitsu Microelectronics Limited, Yokohama (JP)

( * ) Notice: Subject to any disclaimer, the term of this patent is extended or adjusted under 35 U.S.C. 154(b) by 554 days.

(21) Appl. No.: 11/589,084

(22) Filed: Oct. 30, 2006

(65) Prior Publication Data

US 2008/0001258 A1 Jan. 3, 2008

(30) Foreign Application Priority Data

Jun. 30, 2006 (JP) .............................. 2006-181946

(51) Int. Cl.
*H01L 29/00* (2006.01)
(52) U.S. Cl. .............................. 257/607; 257/E21.644; 438/197
(58) Field of Classification Search ................. 257/315, 257/371, 607, 499, 510, E21.644, E27.063, 257/E27.107, E21.68, 314, 317; 438/197, 438/232, 257, 424
See application file for complete search history.

(56) References Cited

U.S. PATENT DOCUMENTS

| | | | |
|---|---|---|---|
| 5,861,330 A | 1/1999 | Baker et al. | |
| 6,144,086 A | 11/2000 | Brown et al. | |
| 6,329,693 B1 | 12/2001 | Kumagai | |
| 6,342,413 B1 * | 1/2002 | Masuoka et al. | ............ 438/197 |
| 2002/0153591 A1 | 10/2002 | Nakazato et al. | |
| 2004/0256658 A1 | 12/2004 | Park et al. | |

FOREIGN PATENT DOCUMENTS

| | | | |
|---|---|---|---|
| GB | 2 269 049 A | | 1/1994 |
| GB | 2269049 | * | 1/1994 |
| JP | 6-85200 A | | 3/1994 |
| JP | 3117428 B2 | | 12/2000 |
| JP | 2003-273236 A | | 9/2003 |
| JP | 3564039 B2 | | 9/2004 |

OTHER PUBLICATIONS

Korean Office Action dated October 30, 2008, issued in corresponding Korean Patent Application No. 10-2006-0113933.
European Search Report dated Oct. 18, 2007, issued in corresponding European Patent Application No. 06122692.4.

* cited by examiner

*Primary Examiner*—Thomas L Dickey
*Assistant Examiner*—Fazli Erdem
(74) *Attorney, Agent, or Firm*—Westerman, Hattori, Daniels & Adrian, LLP

(57) ABSTRACT

According to the present invention, provided is a semiconductor device including: a p-type silicon substrate; a shallow n-well formed in the silicon substrate; a shallow p-well formed beside the shallow n-well in the silicon substrate; and a deep n-well which is formed beside the shallow p-well in the silicon substrate, and which is deeper than the shallow p-well. In addition, a deep p-well, which is deeper than the shallow p-well, is formed between the shallow p-well and the deep n-well in the silicon substrate.

23 Claims, 41 Drawing Sheets

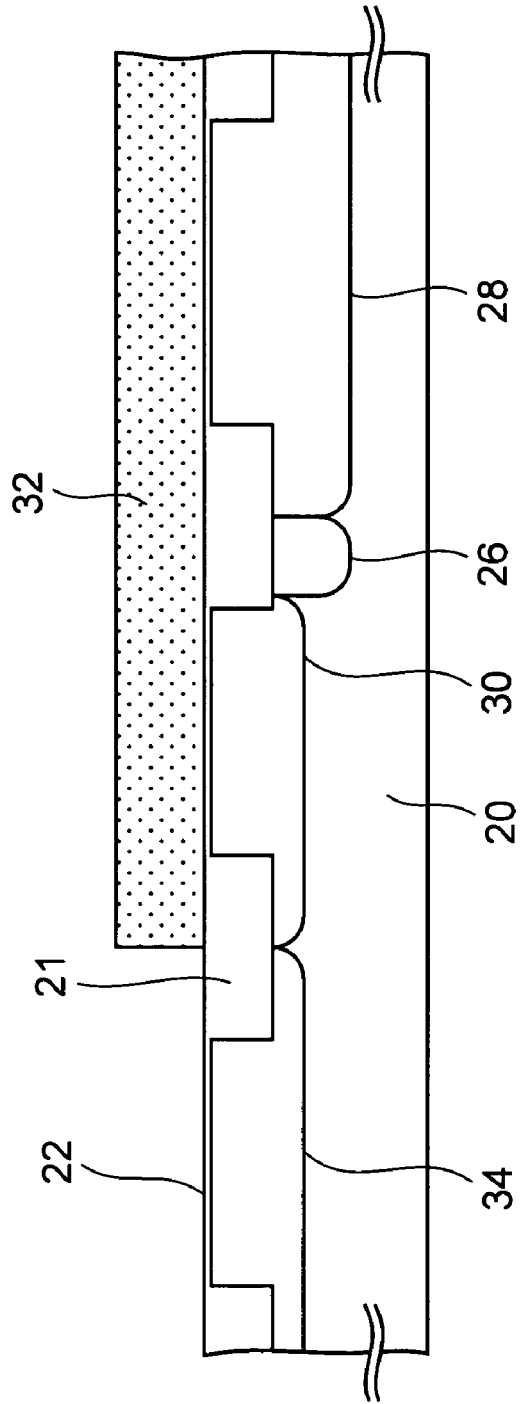
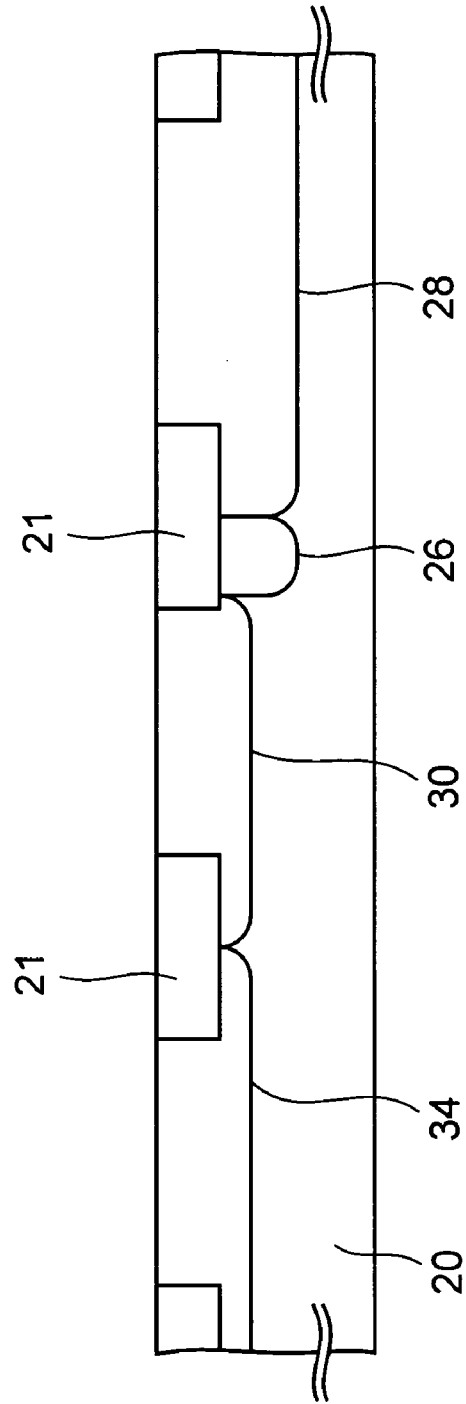
FIG. 7E
FIG. 7F

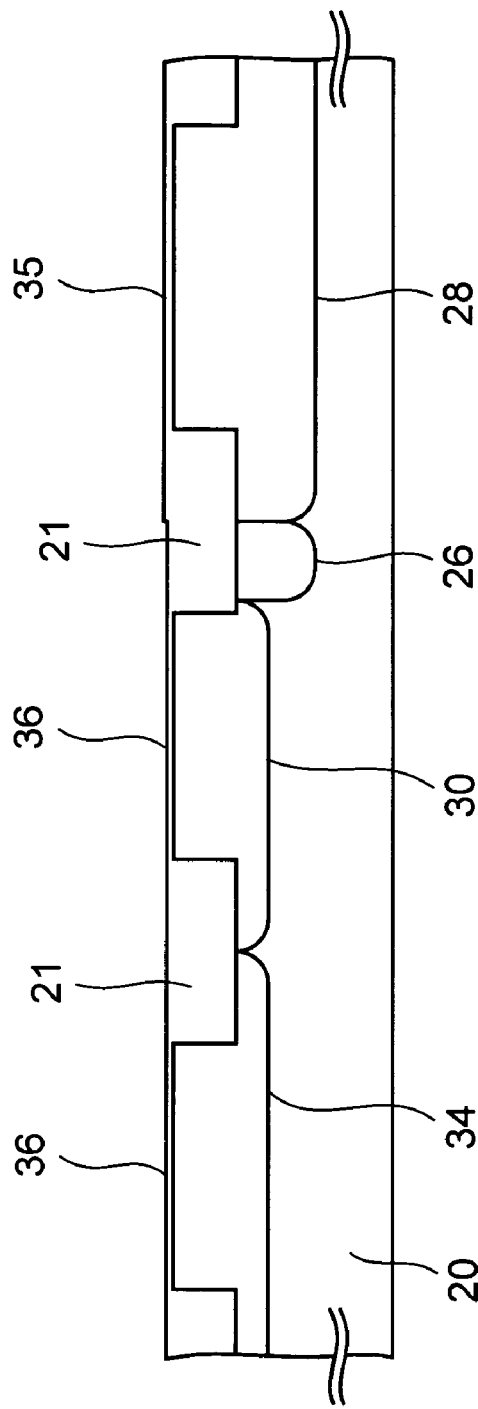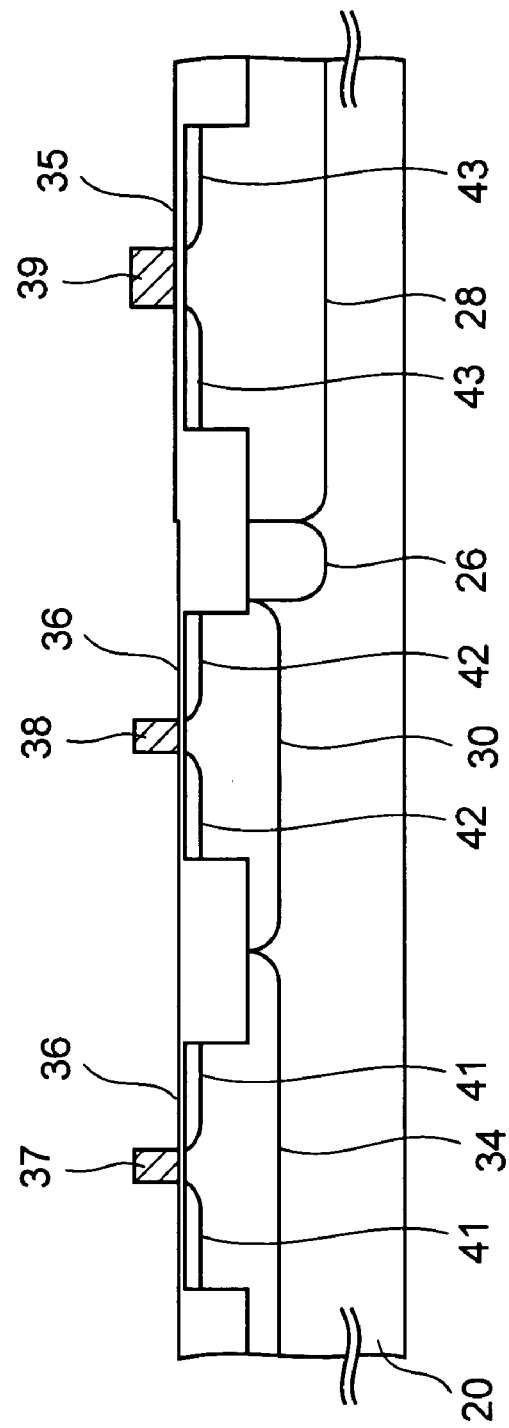

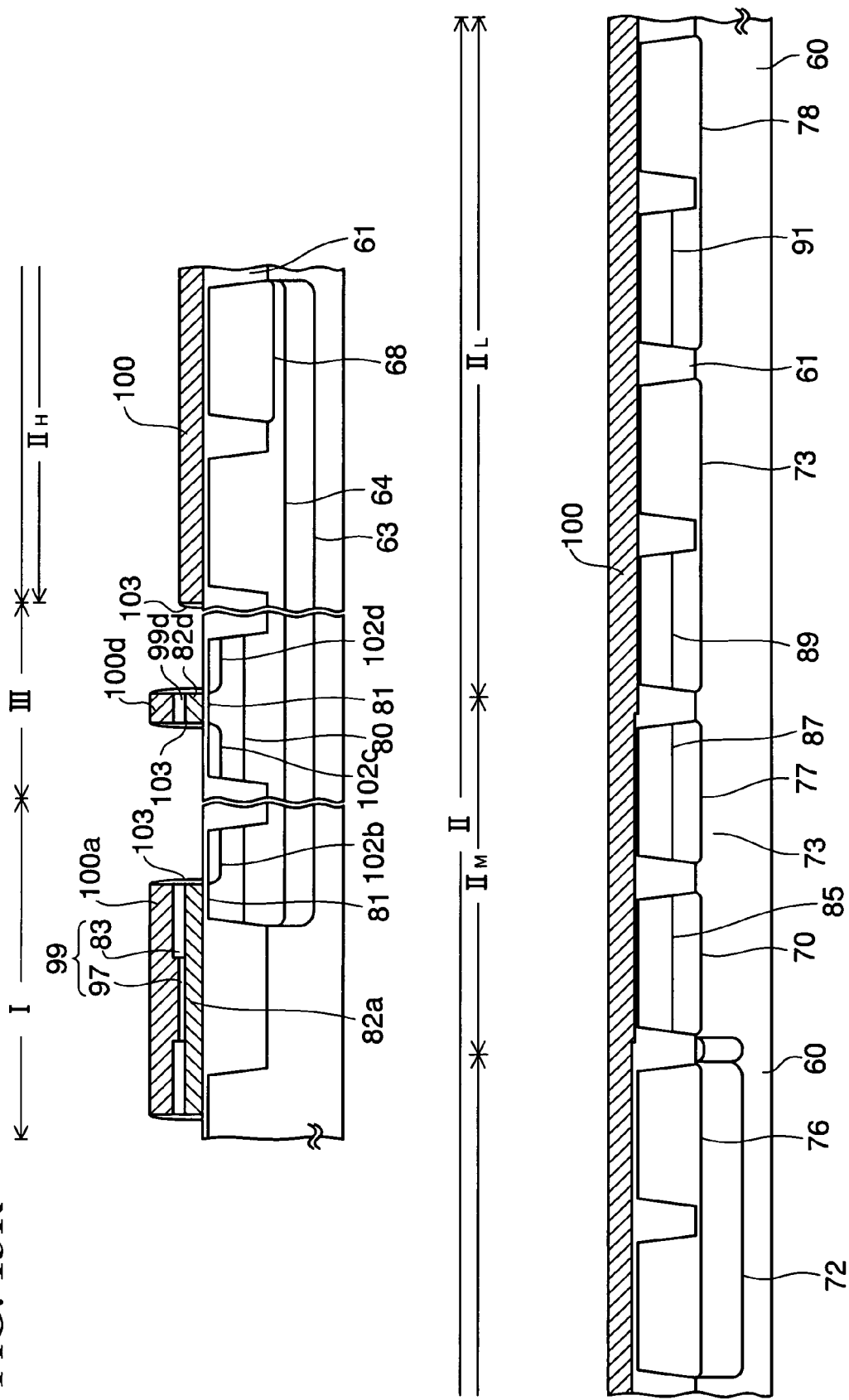

SEMICONDUCTOR DEVICE AND METHOD OF MANUFACTURING THE SAME

CROSS-REFERENCE TO RELATED APPLICATIONS

This application is based on and claims priority of Japanese Patent Application No. 2006-181946 filed on Jun. 30, 2006, the entire contents of which are incorporated herein by reference.

BACKGROUND OF THE INVENTION

1. Field of the Invention

The present invention relates to a semiconductor device and a method of manufacturing the same.

2. Description of the Related Art

In a semiconductor device such as LSI, a number of MOS transistors are integrally formed on a semiconductor substrate. However, it is rare that operating voltages of all the MOS transistors are the same. In general, MOS transistors each operating at a high voltage (high-voltage MOS transistors) and MOS transistors each operating at a low operating voltage (low-voltage MOS transistors) are embedded in the silicon substrate.

As an example of such a semiconductor device, FIG. 1 shows a configuration diagram of a semiconductor device in which a non-volatile memory and logic circuits are embedded.

As shown in FIG. 1, in this semiconductor device, a plurality of flash memory cells FL are formed in a cell region 1 as non-volatile memory cells. In addition, around this cell region 1, a row selection circuit 2, a column selection circuit 3, a sense amplifier 4, and a booster circuit 5 are formed as logic circuits. Then, each of the memory cells FL is selected by one of word lines WLi (i=1, 2, . . . ) each connected to the row selection circuit 2 and one of bit lines BLj (j=1, 2, . . . ) each connected to the column selection circuit 3.

Programming of each memory cell is done by applying high voltage such as 5V to a BL selected by the column selection circuit 3 and applying high voltage such as 9V to a WL selected by the row selection circuit 2.

On the other hand, erasing of memory cells is done by applying high voltage such as 10V to substrate and applying high voltage such as −10V to WL. At that time, the applied high voltage such as 10V to substrate is also applied to all BL through forward biased drain junction.

Thus, both row and column selection circuits 2 and 3 are formed of high voltage transistors.

In contrast, the sense amplifier 4, which reads information from each of the cells, is formed of low-voltage MOS transistors operating at a low voltage of approximately 1.2V.

In this manner, the semiconductor device in which the non-volatile memory and the logic circuits are embedded has a configuration in which the high-voltage transistors and the low-voltage transistors are embedded.

FIG. 2 shows a more detailed configuration diagram of the above-described semiconductor device. An example of FIG. 2 shows a state in which flash memory cells FL1 and FL3 are unselected and in which a flash memory cell FL 2 is selected.

FIG. 3 is a cross-sectional view of a semiconductor device in which high-voltage transistors and low-voltage transistors are mounted as described above.

In an example of FIG. 3, transistor formation regions are defined in a p-type silicon substrate 10 by element isolation insulating films 11. A first n-well 12, a p-well 13, and a second n-well 14 are formed in each of the transistor formation regions as shown in the figure.

In addition, gate electrodes 15 are formed on these wells 12 to 14 with gate insulating films interposed therebetween. Furthermore, a first p-type source/drain region 18, an n-type source/drain region 19, and a second p-type source/drain region 17 are formed respectively beside the gate electrodes 15.

Thus, a low-voltage p-type MOS transistor $TR_p(low)$, a low-voltage n-type MOS transistor $TR_n(low)$, and a high-voltage p-type MOS transistor $TR_p(high)$ are constructed respectively of pairs of the gate electrodes 15 and the corresponding source/drain regions 17 to 19.

In the high-voltage p-type MOS transistor $TR_p(high)$, a high-voltage is applied to the second p-type source/drain region 17. For this reason, punch through is easily generated between the second p-type source/drain region 17 and the p-type silicon substrate 10.

The punch through is often observed in the case where the second n-well 14 is shallow.

Therefore, in general the second n-well 14 is formed deeply.

In contrast, if the first n-well 12 and the p-well 13, in which the low-voltage MOS transistors $TR_p(low)$ and $TR_n(low)$ are formed respectively, are formed deeply, impurities in the respective wells spread in lateral directions. This makes it difficult to shorten the distance between, for example, the first p-type source/drain region 18 and n-type source/drain region 19. Thereby, this causes a problem that it is difficult to downsize a semiconductor device. For this reason, the first n-well 12 and the p-well 13 are generally formed to be shallower than the second n-well 14.

However, if the wells 12 and 13 used for the low-voltage transistors are shallower than the well 14 used for the high-voltage transistor, a parasitic NPN bipolar transistor formed along a path P as shown in FIG. 3 becomes critical.

FIG. 4 is a diagram showing a height of a potential for electrons along the path P in the case where both of the p-type silicon substrate 10 and the first n-well 12 are set at a ground potential (0V), and a high-voltage (10V) is applied to the second n-well 14.

As shown in FIG. 4, a height V of the potential barrier formed between the first n-well 12 and the substrate 10 is made to be lowered, because impurity concentration of the p-type silicon substrate 10, functioned as a base of the parasitic NPN bipolar transistor, is low. Accordingly, even when only a small base current $I_B$ flows, the electrons in the substrate 10 decrease. Thus, the potential becomes low as shown by the dotted line, thereby causing a large collector current $I_C$ to flow from the second n-well 14 to the first n-well 12.

As a result, a current amplification factor $\beta$ ($=I_C/I_B$) of the NPN bipolar transistor becomes extremely large, thereby making latch-up easily occur. The latch-up is a phenomenon in which an excessive current flows between the n-wells 12 and 14 through the path P.

Such a problem also occurs in a semiconductor device having a cross-sectional structure shown in FIG. 5.

This semiconductor device is formed by making the first n-well 12 deeper than that in the example of FIG. 4, and by forming a high-voltage p-type MOS transistor $TR_p(high)$ on the well 12. Other than this, the semiconductor device has the configuration same as that of the example of FIG. 4.

In this semiconductor device, there is also a problem in that latch-up along the path P easily occurs due to the reason same as that described in FIG. 4.

In Specification of Japanese Patent No. 3564039 and Specification of Japanese Patent No. 3117428, it is disclosed that latch-up can be suppressed by forming, at end portions of each of the wells, high-concentration impurity layers each having the conductive type same as that of the well.

A structure shown in FIG. 6 is obtained by applying such high-concentration impurity layers to the semiconductor device of FIG. 5.

As shown in FIG. 6, in this example, in line with Specification of Japanese Patent No. 3564039 and Specification of Japanese Patent No. 3117428, n-type high-concentration impurity layers 12a and 14a, and p-type high-concentration impurity layers 13a are formed at end portions of the respective wells 12 to 14.

However, even when such high-concentration impurity layers 12a to 14a are formed, a base concentration of the NPN parasitic bipolar transistor is not changed and stays equal to that of the case of FIG. 5. Therefore, a height of the potential for the electrons along the path P remains low. For this reason, latch-up still easily occurs along the path P.

In addition to these, a technology relating to the present invention is also disclosed in Official Gazette of Japanese Patent Application No. 2003-273236.

SUMMARY OF THE INVENTION

According to an aspect of the present invention, there is provided a semiconductor device including a semiconductor substrate of a first conductive type, a first well of a second conductive type formed in the semiconductor substrate, where the second conductive type being opposite type of the first conductive type, a second well of the first conductive type formed beside the first well in the semiconductor substrate, and a third well of the second conductive type which is formed beside the second well in the semiconductor substrate and which is deeper than the second well. Moreover, in the semiconductor device, a fourth well of the first conductive type, which is deeper than the second well, is formed between the second well and the third well in the semiconductor substrate.

In such a semiconductor device, an NPN or PNP bipolar transistor is formed of the first well, the semiconductor substrate, and the third well. In the present invention, the fourth well is deeply formed between the second well and the third well, and the fourth well is the conductive type same as that of the semiconductor substrate. Accordingly the fourth well increase the impurity concentration of the base of the above-described parasitic bipolar transistor. This makes it possible to suppress an increase in a current amplification factor of the parasitic bipolar transistor. Thus, it becomes possible to prevent the parasitic bipolar transistor from being powered on, and thereby to suppress latch-up from occurring.

Furthermore, in the present invention, a depth of the third well is made deeper than that of the first well or the second well. Thereby, a distance between a MOS transistor source/drain region formed in the third well and a p-n junction between the semiconductor substrate and the third well can be enlarged. For this reason, punch through, in which carriers unnecessarily flow between the source/drain region and the substrate, can be suppressed.

On the other hand, the first well or the second well is formed with a shallower depth than that of the third well. This makes it difficult for impurities in the first well or the second well to diffuse in lateral directions. Thus, downsizing of a semiconductor device becomes possible.

In addition, according to another aspect of the present invention, there is provided a semiconductor device including a semiconductor substrate of a first conductive type, a first well of a second conductive type formed in the semiconductor substrate, where the second conductive type being opposite type of the first conductive type, a second well of the first conductive type formed beside the first well in the semiconductor substrate, and a third well of the second conductive type, which is formed beside the first well in the semiconductor substrate beside the second well and which is deeper than the second well. In the semiconductor device, moreover, a forth well of the first conductive type is formed between the second well and the third well in the semiconductor substrate, and the fourth well is deeper than the second well. In the semiconductor device, furthermore, an absolute value of a voltage applied to the third well is larger than that of a voltage applied to the first well or that of a voltage applied to the second well.

In addition, according to another aspect of the present invention, there is provided a method of manufacturing a semiconductor device. The method includes the steps of: forming a first well of a second conductive type in a semiconductor substrate of a first conductive type, where the second conductive type being opposite type of the first conductive type; forming a second well of the first conductive type beside the first well in the semiconductor substrate; forming a third well of the second conductive type, which is deeper than the second well, beside the second well in the semiconductor substrate; and forming a fourth well of the first conductive type, which is deeper than the second well, between the second well and the third well in the semiconductor substrate.

Here, in the step of forming the fourth well, the fourth well may be formed in a planar shape which is obtained by expanding an outline of the third well, so that the fourth well surrounds the third well. According to this, it does not take a time to design the fourth well, since design data of the fourth well can be easily obtained from design data of the third well. This makes it possible to create a shielding pattern of a reticle for forming a resist pattern for separately implanting impurities, and to suppress an increase of manufacturing cost of the semiconductor device with the formation of the fourth well.

Moreover, in the step of forming the fourth well, a fifth well of the first conductive type may be also formed beside the first well in the silicon substrate. In this case, it is preferable to additionally carry out a step of forming a MOS transistor having a Complementary Metal Oxide Semiconductor (CMOS) structure in each of the first well and the fifth well. With this, the fourth well is formed at the same time when the fifth well for MOS transistor having the CMOS structure is formed, thereby eliminating an additional new step of forming the fourth well.

BRIEF DESCRIPTION OF THE DRAWINGS

FIGS. 7A to 7K are cross-sectional views each showing a semiconductor device in the middle of manufacturing according to a first embodiment of the present invention;

DESCRIPTION OF THE PREFERRED EMBODIMENTS

Preferred embodiments for carrying out the present invention will be described below by referring to the accompanying drawings.

(1) First Embodiment

FIGS. 7A to 7K are cross-sectional views each showing a semiconductor device in the middle of manufacturing according to a first embodiment of the present invention.

Figure 1:
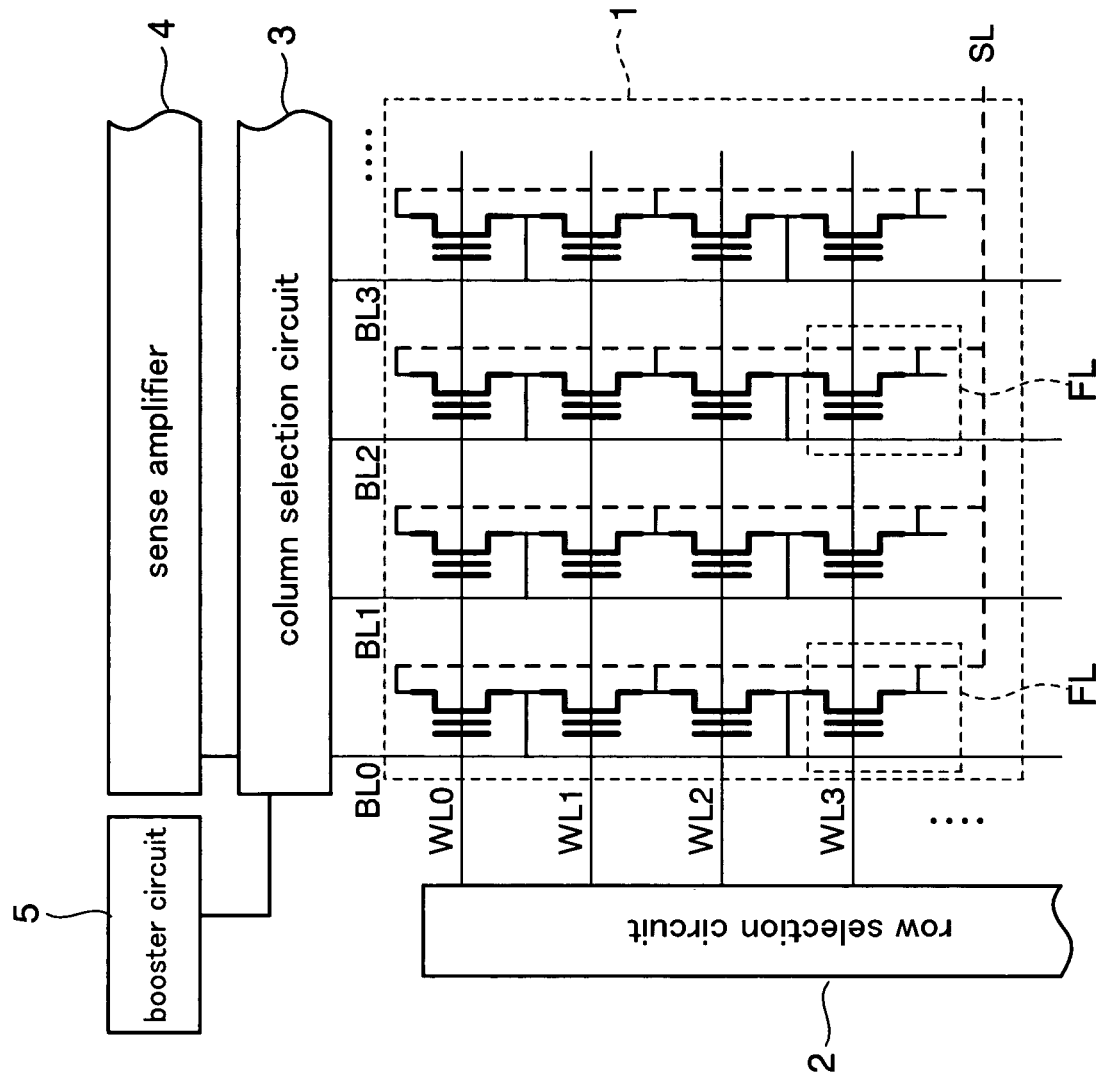
FIG. 1 is a configuration diagram of a semiconductor device according to a conventional example.
Figure 2:
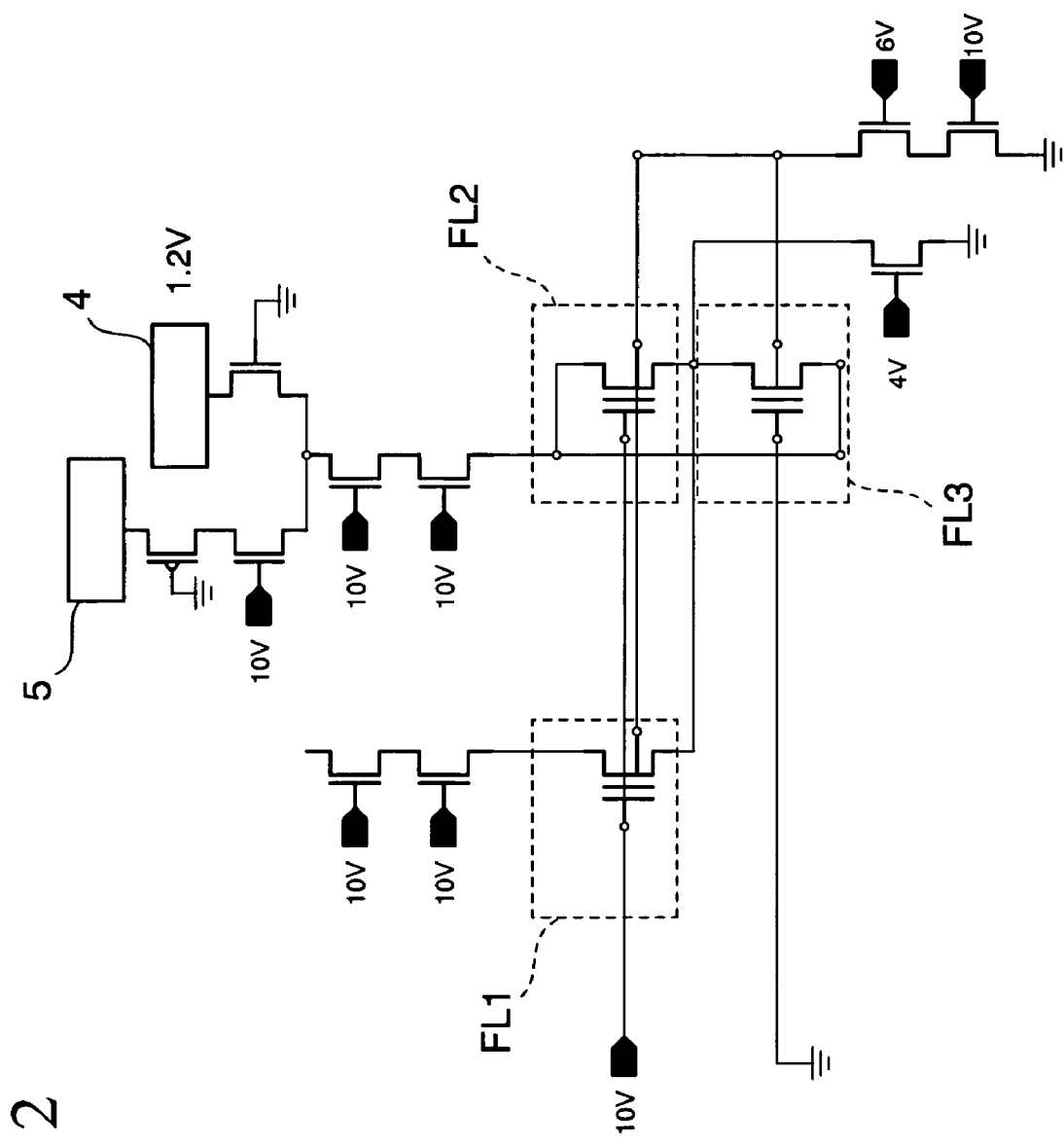
FIG. 2 is a more detailed configuration diagram of the semiconductor device of FIG. 1.
Figure 3:
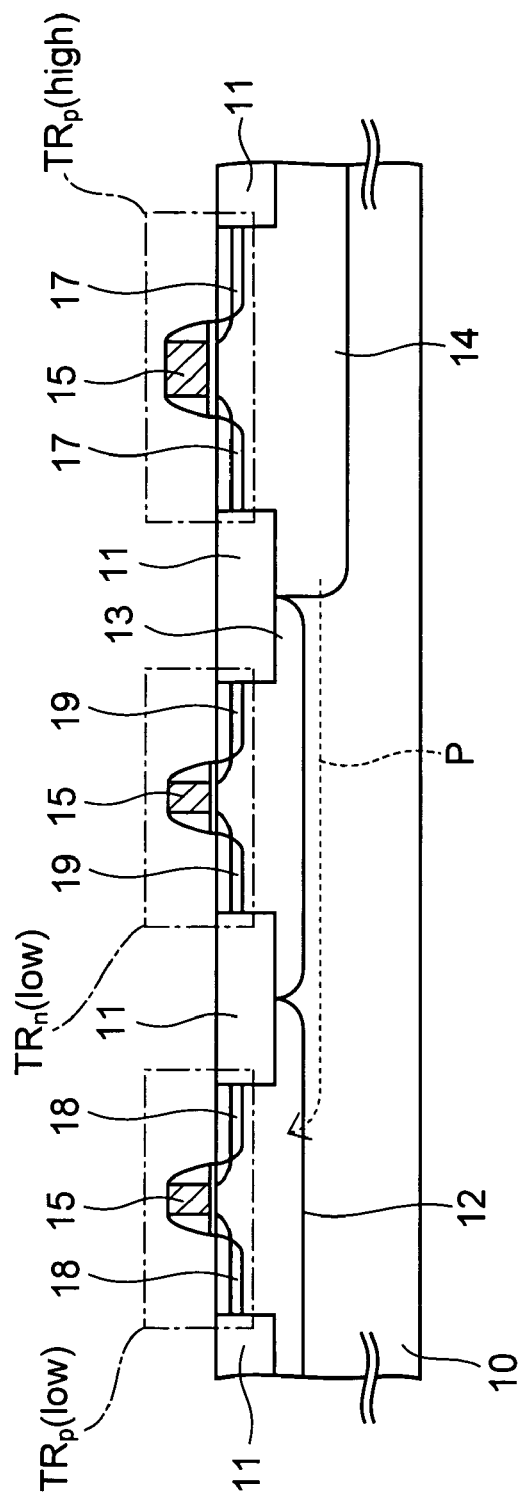
FIG. 3 is a cross-sectional view of a semiconductor device of a conventional example, in which high-voltage MOS transistors and low-voltage MOS transistors are mixedly mounted.
Figure 4:
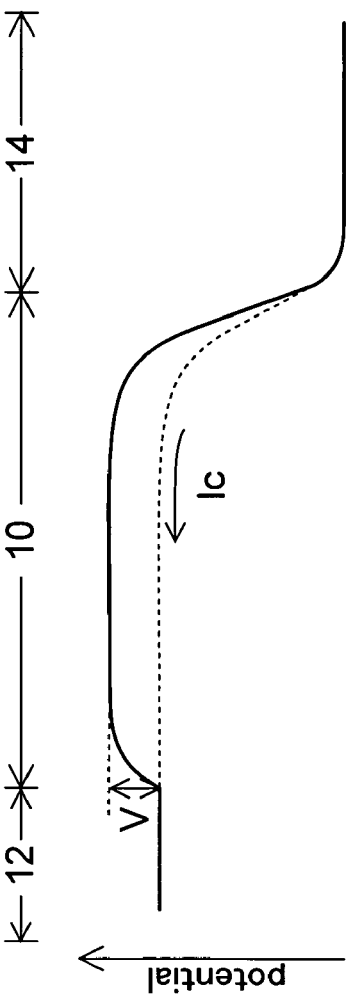
FIG. 4 is a diagram showing a height of a potential of the semiconductor device shown in FIG. 3.
Figure 5:
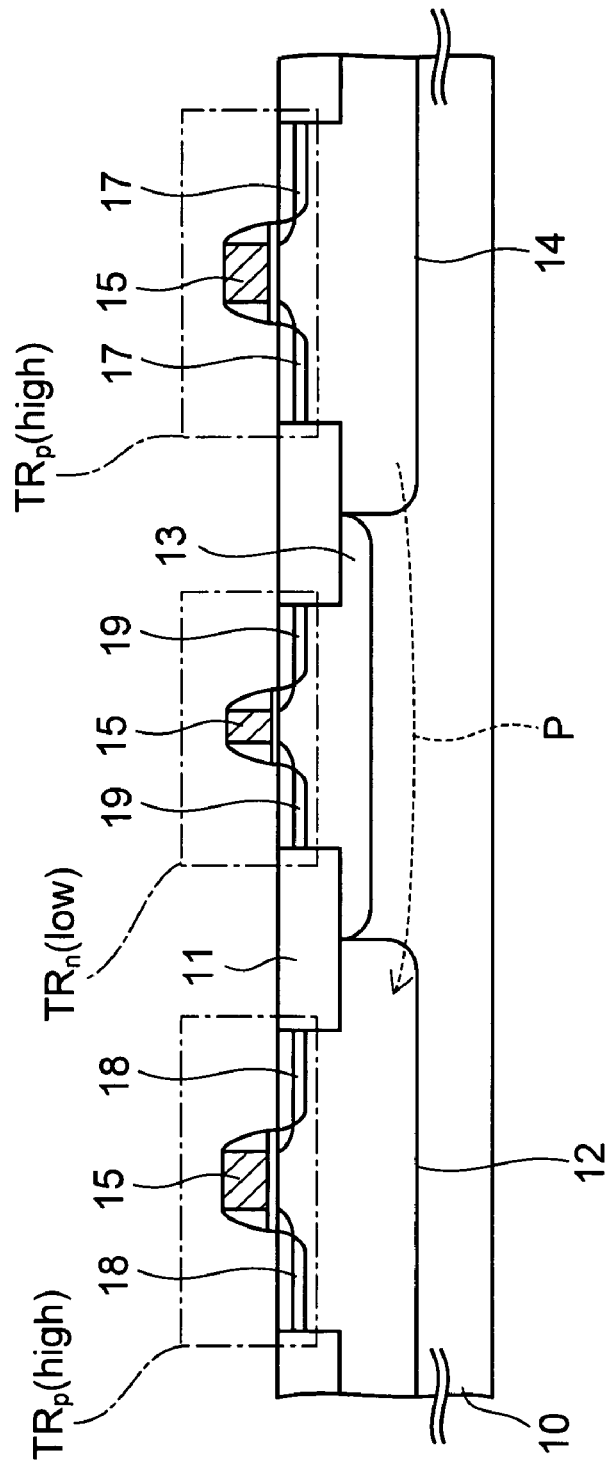
FIG. 5 is a cross-sectional view of another semiconductor device according to a conventional example.
Figure 6:
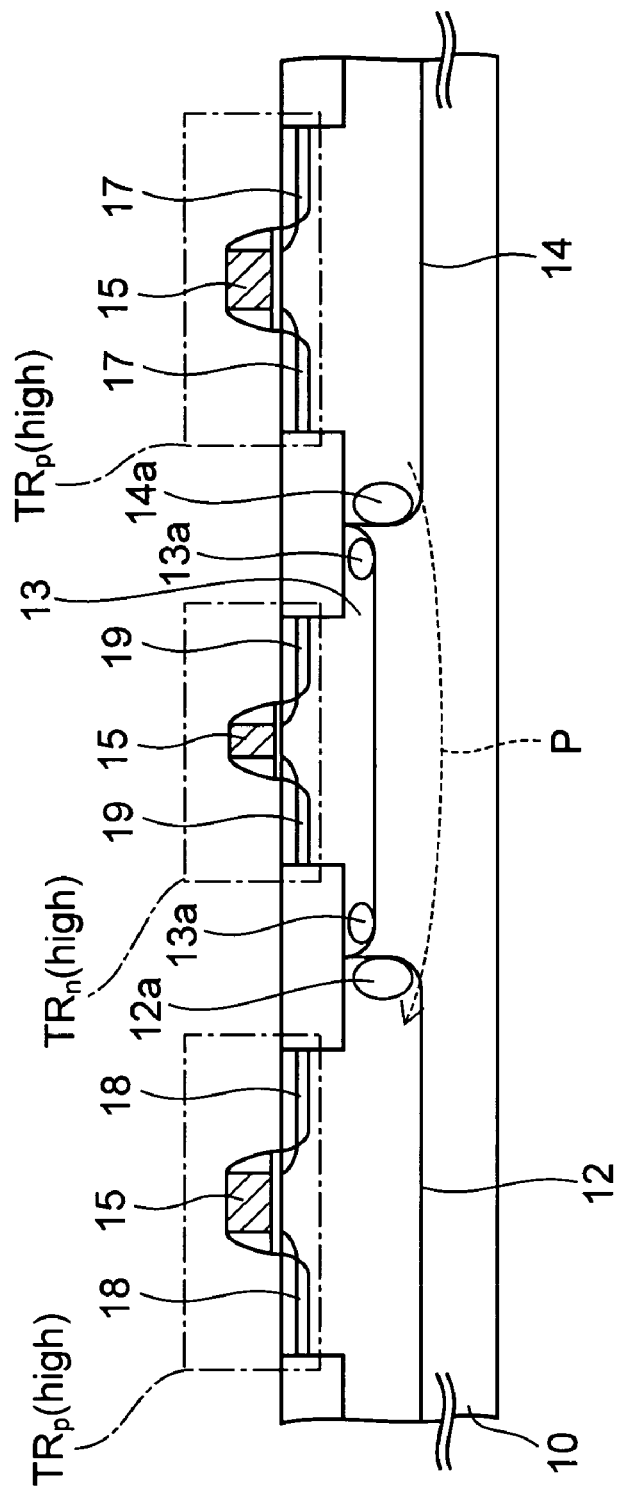
FIG. 6 is a cross-sectional view for describing that latch-up cannot be suppressed by using the prior art described in Japanese Patents No. 3564039 and No. 3117428.
Figure 7A:
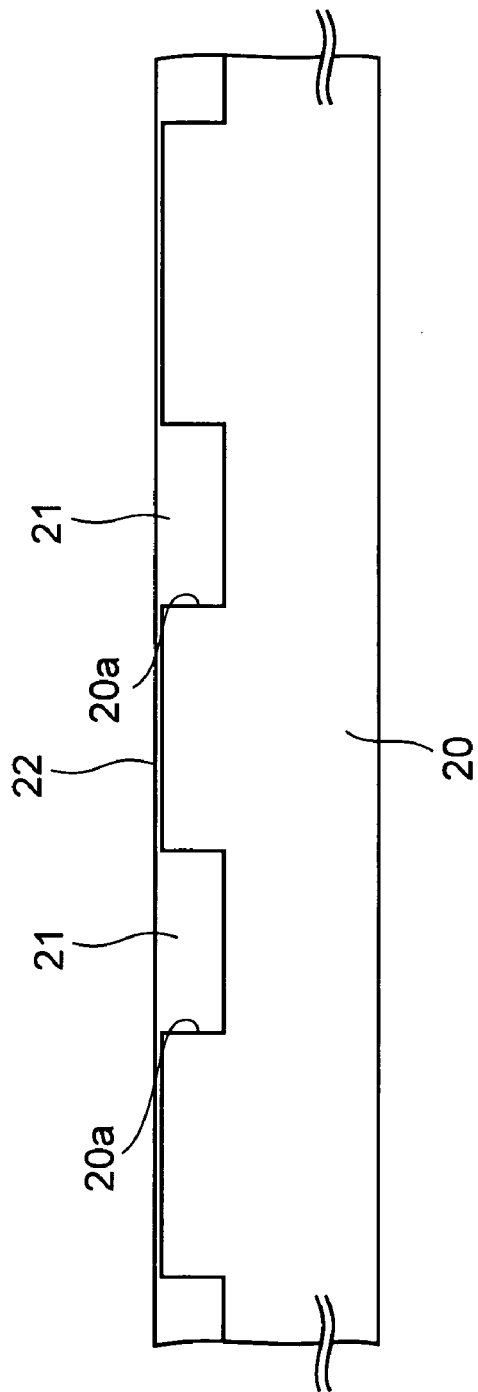

Firstly, as shown in FIG. 7A, an element isolation trench 20a is formed in a p-type silicon (semiconductor) substrate 20. Then, a silicon oxide film is embedded in this element isolation trench 20a as an element isolation insulating film 21. After that, a thermal oxidation film 22 is formed with a thickness of approximately 10 nm on the upper surface of the silicon substrate 20.

Figure 7B:
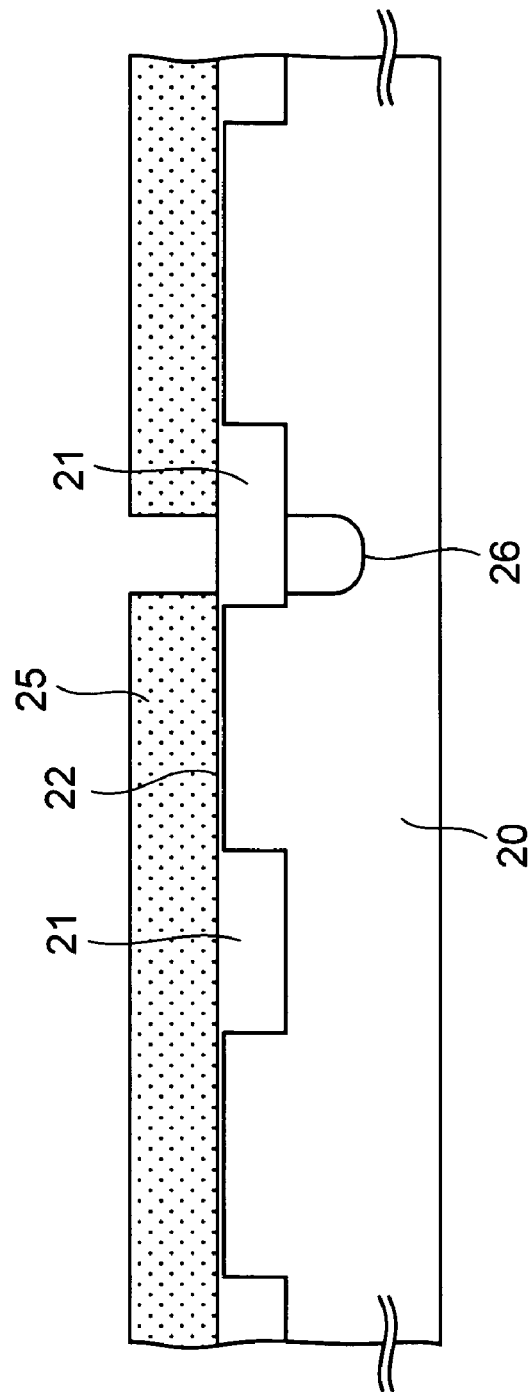

Next, as shown in FIG. 7B, a first resist pattern 25 is formed on the entire upper surface of the resultant silicon substrate 20. Then, while using the first resist pattern 25 as a mask, boron ions are implanted as a p-type impurity in the silicon substrate 20 by two steps of ion implantation, thereby forming a deep p-well (a fourth well) 26. Conditions used for the ion implantation are not particularly limited. In the present embodiment, however, the first step of ion implantation employs the following conditions that acceleration energy is 400 keV and that a dose amount is $1.5 \times 10^{13}$ cm$^{-2}$. In addition, the second step of ion implantation employs the following conditions that acceleration energy is 100 keV and that a dose amount is $2 \times 10^{12}$ cm$^{-2}$.

Thereafter, the first resist pattern 25 is removed.

Figure 7C:
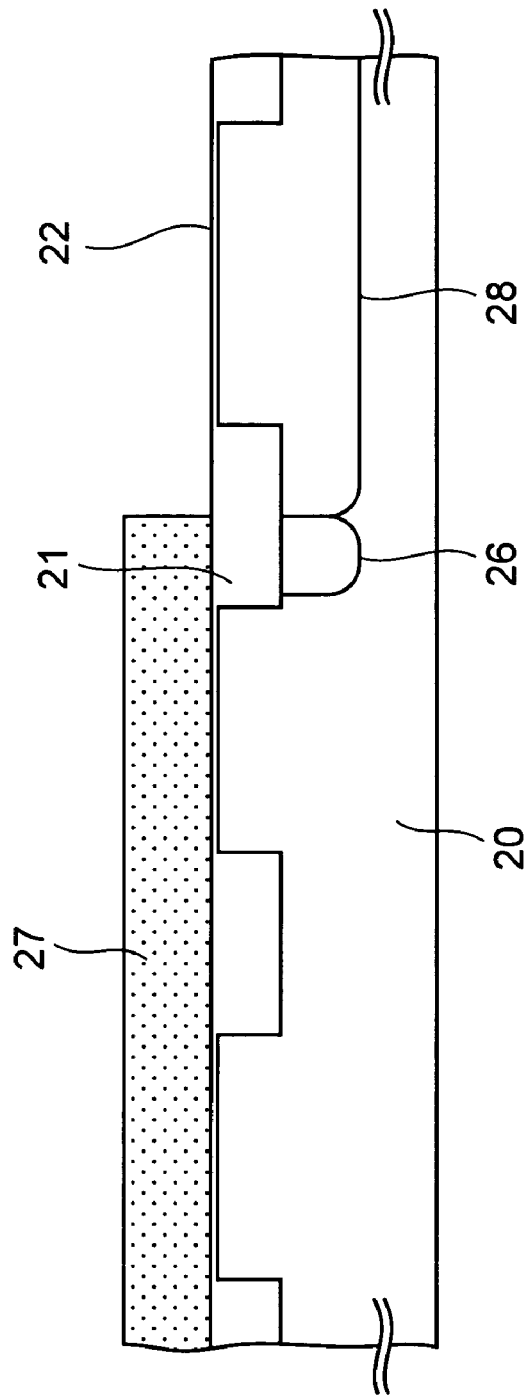

Next, as shown in FIG. 7C, a second resist pattern 27 is formed on the entire upper surface of the silicon 20. Then, while using the second resist pattern 27 as a mask, phosphorus ions are implanted as n-type impurities in the silicon substrate 20.

With this ion implantation, a deep n-well (a third well) 28 is formed beside the deep p-well 26. In addition, this ion implantation is carried out at two steps. The first step of ion implantation employs conditions that acceleration energy is 600 keV and that a dose amount is $1.5 \times 10^{13}$ cm$^{-2}$. The second step of ion implantation employs conditions that acceleration energy is 240 keV and that a dose amount is $3 \times 10^{12}$ cm$^{-2}$.

After this ion implantation, the second resist pattern 27 is removed.

Figure 7D:
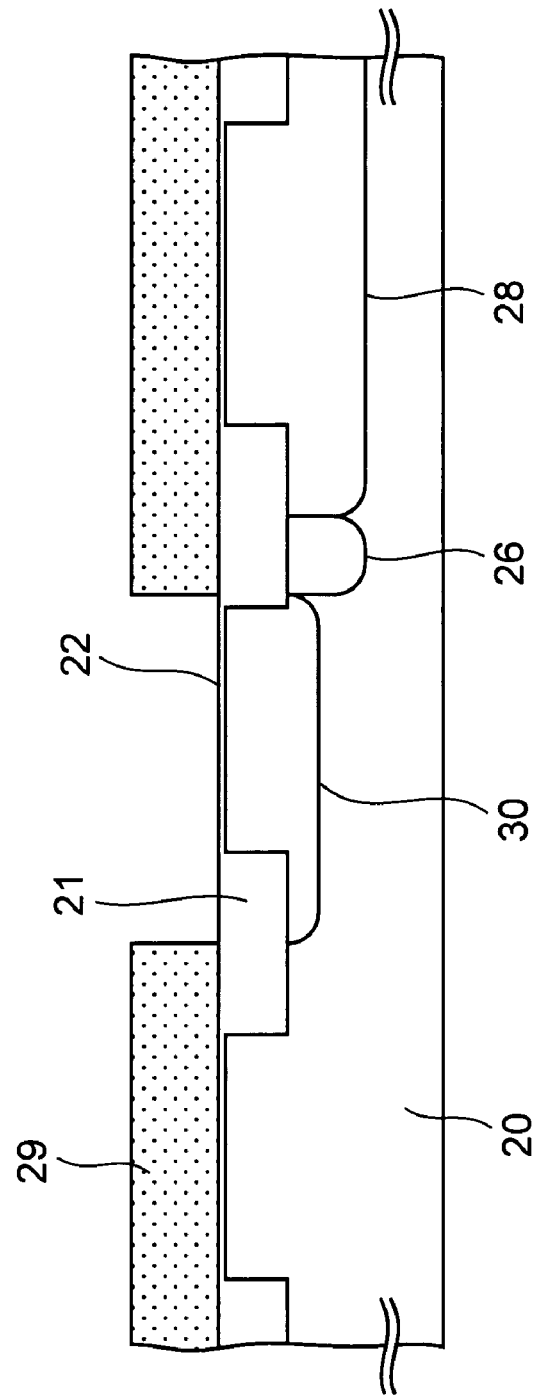

Next, as shown in FIG. 7D, a third resist pattern 29 is formed on the entire upper surface of the resultant silicon substrate 20.

Thereafter, by ion implantation under the conditions that the acceleration energy is 240 keV and that the dose amount is $3 \times 10^{13}$ cm$^{-2}$, boron ions are implanted as a p-type impurity in the resultant silicon substrate 20 through a window of the third resist pattern 29. Thus, a shallow p-well (a second well) 30 is formed.

After that, the third resist pattern 29 is removed.

Next, as shown in FIG. 7E, a fourth resist pattern 32 is formed on the entire upper surface of the resultant silicon substrate 20. Then, while using the fourth resist pattern 32 as a mask, phosphorus ions are implanted as n-type impurities in the resultant silicon substrate 20. Thus, a shallow n-well (a first well) 34 is formed beside the shallow p-well 30. Conditions for the ion implantation in this case are not particularly limited, but the present embodiment employs the conditions that acceleration energy is 360 keV and that a dose amount is $3 \times 10^{13}$ cm$^{-2}$.

After the ion implantation is completed, the fourth resist pattern 32 is removed.

Next, as shown in FIG. 7F, the thermal oxidation film 22, which is used as a through film for each of the above-described ion implantations, is removed by wet etching using HF solution. Thereby, the clean surface of the resultant silicon substrate 20 is exposed to the outside.

Next, steps required for obtaining a cross-sectional structure shown in FIG. 7G will be described.

Firstly, a thermal oxidation film is formed with a thickness of approximately 13 nm on the upper surface of the resultant silicon substrate 20 under an oxidation condition that a substrate temperature is 850° C. The formed thermal oxidation film is used as a first gate insulating film 35.

Next, the first gate insulating film 35 on the shallow p-well 30 and the shallow n-well 34 is removed by wet etching using the photolithography technique and the HF solution.

Thereafter, the upper surface of the resultant silicon substrate 20 is again thermally oxidized by heating the silicon substrate 20 at a temperature of 850° C. Thus, the thermal oxidation film is formed with a thickness of approximately 2.5 nm on the upper surface of the resultant silicon substrate 20 on each of the wells 30 and 34. The thermal oxidation film is used as a second gate insulating film 36. At this time, the resultant silicon substrate 20 under the first gate insulating film 35 which has been already formed is also thermally oxidized. As a result, a thickness of the first gate insulating film 35 increases.

By those two steps of thermal oxidations, the thick first gate insulating film 35 and the thin second gate insulating film 36 are formed on the upper surface of the resultant silicon substrate 20.

Next, as shown in FIG. 7H, a polysilicon film is formed on the first and second gate insulating films 35 and 36. Thereafter, first to third gate electrodes 37 to 39 are formed by patterning the polysilicon film.

After that, n-type impurity ions such as arsenic are implanted in the resultant silicon substrate 20 on both sides of the second gate electrode 38. Thereby, an n-type source/drain extension 42 is formed.

Furthermore, boron ions are implanted as p-type impurities in the resultant silicon substrate 20 on both sides of each of the first and third gate electrodes 37 and 39. Thus, first and second p-type source/drain extensions 41 are formed beside the gate electrode 37, and first and second p-type source/drain extensions 43 are formed beside the gate electrode 39.

It should be noted that the above-described n-type impurities and p-type impurities are selectively implanted by using resist patterns, which is not shown.

Figure 7I:
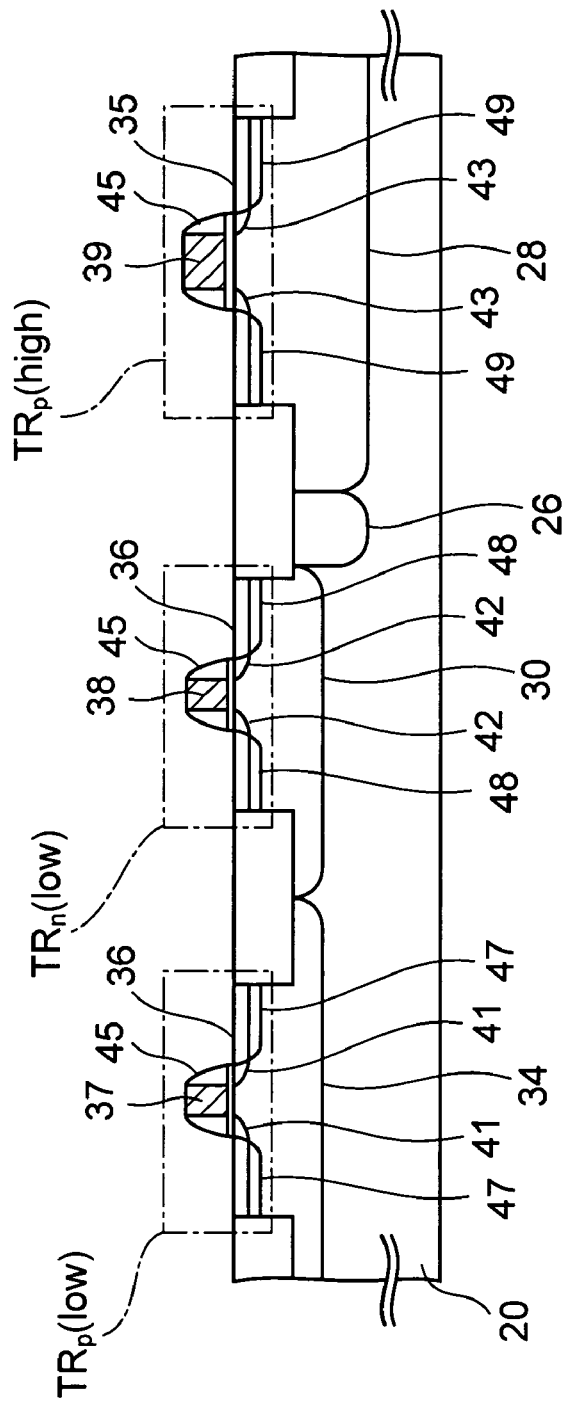

Next, steps required for obtaining a cross-sectional structure shown in FIG. 7I will be described.

Firstly, an insulating film is formed on the entire upper surface of the resultant silicon substrate 20. In the present embodiment, a silicon oxide film is formed as the insulating film by using the CVD method. After that, the insulating film is etched back to be left at both sides respectively of the first to third gate electrodes 37 to 39 as insulating side walls 45.

Next, by using the photolithography technique and the ion implantation, n-type source/drain regions 48 are formed in the resultant silicon substrate 20 on both sides of the second gate electrode 38, and first and second p-type source/drain regions 47 and 49 are formed in the resultant silicon substrate 20 on both sides respectively of the first and third gate electrodes 37 and 39.

By the steps up to here, a low-voltage p-type MOS transistor $TR_p$(low), a low-voltage n-type MOS transistor $TR_n$(low), and a high-voltage p-type MOS transistor $TR_p$(high) have been formed in the silicon substrate 20.

It should be noted that in the present and following embodiments, a high-voltage MOS transistor means a transistor operating at a higher voltage than a low-voltage MOS transistor. That is, the high-voltage MOS transistor has a higher voltage between a gate and a substrate or a higher voltage between a source and the drain than that of the low-voltage MOS transistor.

Figure 7J:
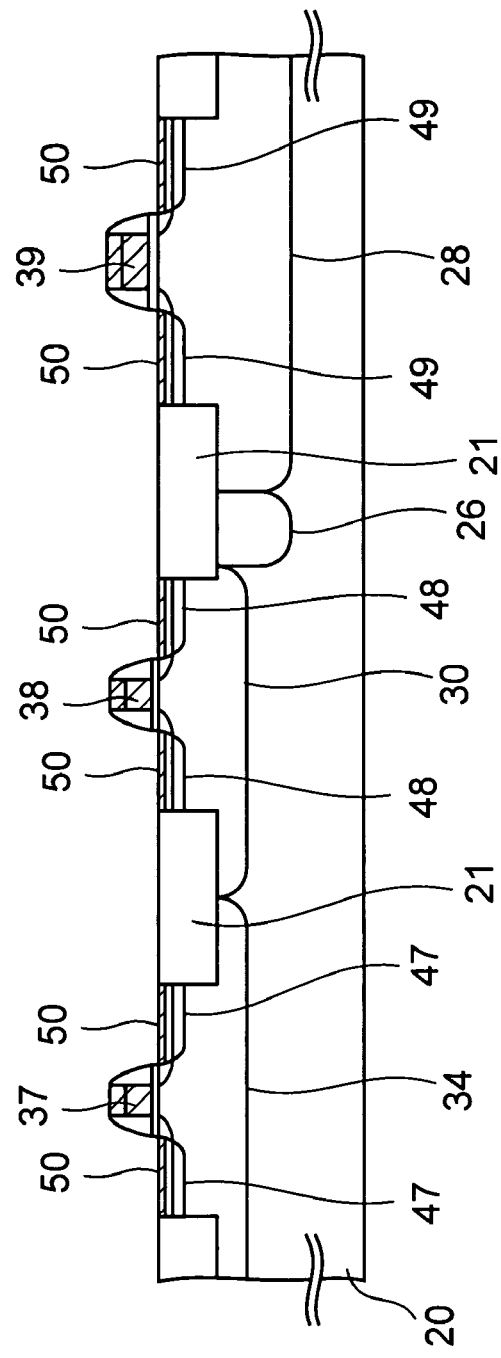

Subsequently, a cobalt film is formed with a thickness of approximately 8 nm on the entire upper surface of the resultant silicon substrate 20 by using the sputtering method. Thereafter, the cobalt film is annealed to react with silicon. Then, the unreacted cobalt film on the element isolation insulating film 21 and the like is removed by wet etching. Thus, cobalt silicide layers 50 are formed on the upper surface of the resultant silicon substrate 20, as shown in FIG. 7J.

Figure 7K:
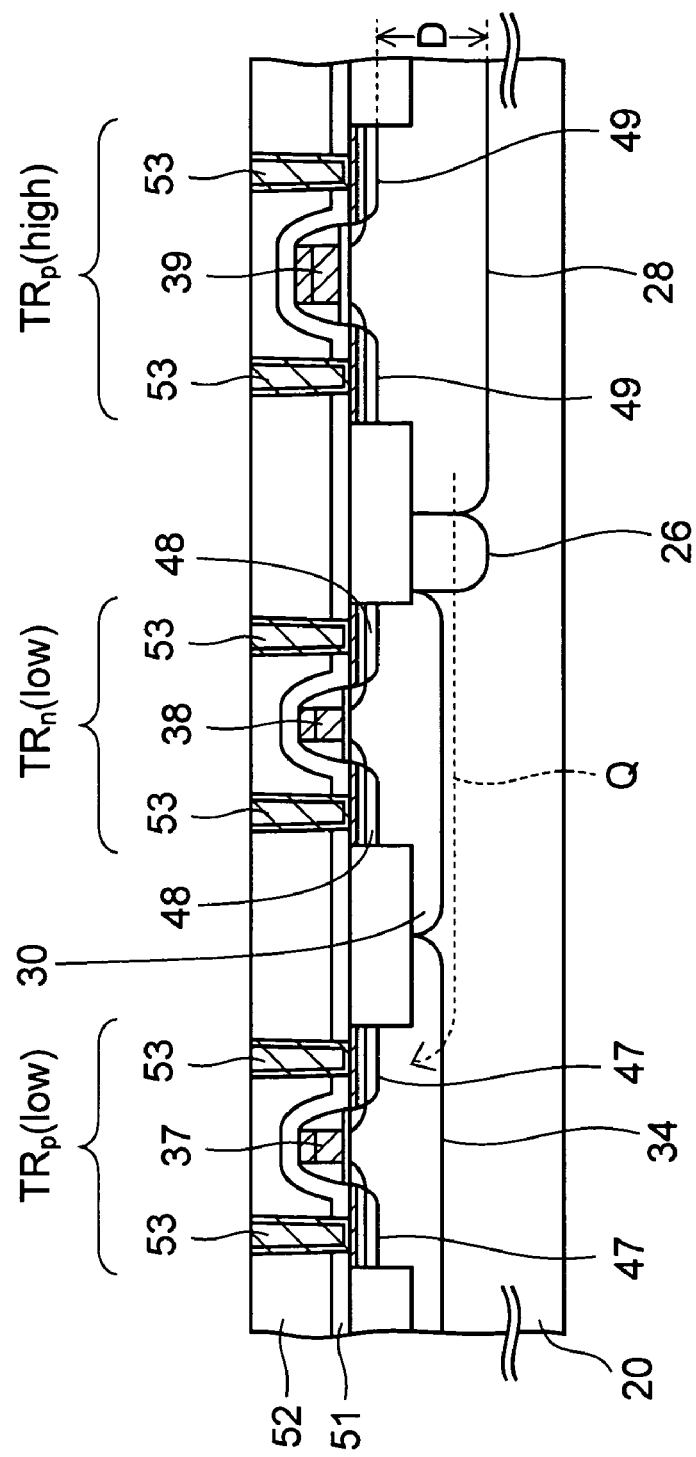

Next, as shown in FIG. 7K, a silicon nitride film is formed with a thickness of approximately 50 nm as a cover insulating film 51 on the entire upper surface of the resultant silicon substrate 20 by using the CVD method. Moreover, a silicon oxide film is formed as an interlayer insulating film 52 on the cover film 51. The interlayer insulating film 52 has a thickness of approximately 1 μm on a flat surface of the resultant silicon substrate 20. Thereafter, about half of the thickness of the interlayer insulating film 52 is polished by using the CMP method. Thus, the surface of the interlayer insulating film 52 is planarized.

Then, the cover insulating film 51 and the interlayer insulating film 52 are respectively patterned, thereby forming contact holes. Conductive plugs 53 mainly made of tungsten are embedded in the contact holes.

Figure 8:
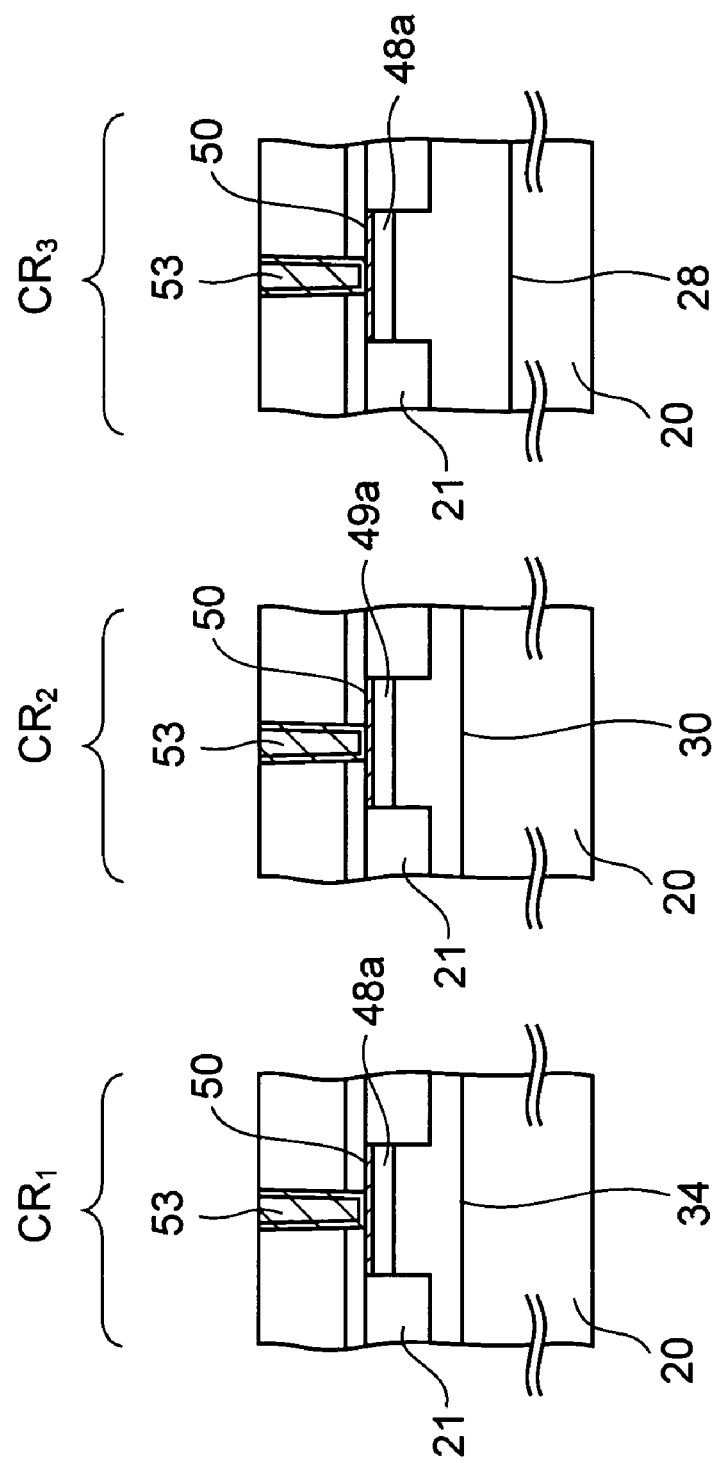
FIG. 8 is a cross-sectional view of a well contact region in the semiconductor device according to the first embodiment of the present invention.

FIG. 8 shows cross-sectional views of the first to third well contact regions $CR_1$ to $CR_3$ which have been processed through the steps up to here.

These regions $CR_1$ to $CR_3$ are regions used for applying voltage to the shallow n-well 34, the shallow p-well 30, and the deep n-well 28, respectively. As shown in the figure, contact n-type impurity diffusion regions 48a are formed respectively in the regions $CR_1$ and $CR_3$, and a contact p-type impurity diffusion region 49a is formed in the regions $CR_2$.

These regions 48a and 49a are formed respectively together with the above-described n-type source/drain region 48 and the second p-type source/drain region 49.

Then, a voltage is individually applied to each of the wells 28, 30 and 34 through the conductive plug 53 formed in each of the regions $CR_1$ to $CR_3$. On the deep n-well 28, the high-voltage MOS transistor $TR_p$(high) is formed. Among these voltages, the voltage applied to the deep n-well 28 is, for example, +10V or −10V. The absolute value of this voltage is larger than those of the voltages (for example, 0V or 1.2V) applied respectively to the shallow n-well 34 and the shallow p-well 30 on which the low-voltage MOS transistors $TR_p$(low) and $TR_n$(low) are respectively formed.

As described above, a basic structure of the semiconductor device according to the present embodiment has been completed.

In the above-described embodiment, as shown in FIG. 7K, there coexist the wells 28, 30 and 34, which respectively have different depths.

Among these, the n-well 28 to which a high-voltage is applied is formed deeper than those of the other wells 30 and 34. Formation of the deep n-well 28 makes is possible to enlarge the distance D between the second p-type source/drain region 49 and the p-n junction between the n-well 28 and the substrate 20. Thereby, it becomes possible to suppress the punch through in which carriers unnecessarily flow between the source/drain region 49 and the silicon substrate 20.

In contrast, a high-voltage is not applied to the p-well 30 and the n-well 34. Accordingly, there is no need to consider the punch through for these wells, so that the p-well 30 and the n-well 34 can be formed shallower than the n-well 28. Formation of these shallow wells 30 and 34 makes it difficult that impurities in these wells 30 and 34 are unnecessarily diffused in the substrate 20. Therefore, downsizing of a semiconductor device becomes possible by minimizing plane sizes of the wells 30 and 34.

As mentioned above, in the present embodiment, the depths of the wells 28, 30 and 34 vary from one another in consideration of problems such as the punch through and the diffusion of impurities. In such a structure, a parasitic NPN bipolar transistor is formed along a path Q shown in FIG. 7K.

Figure 9:
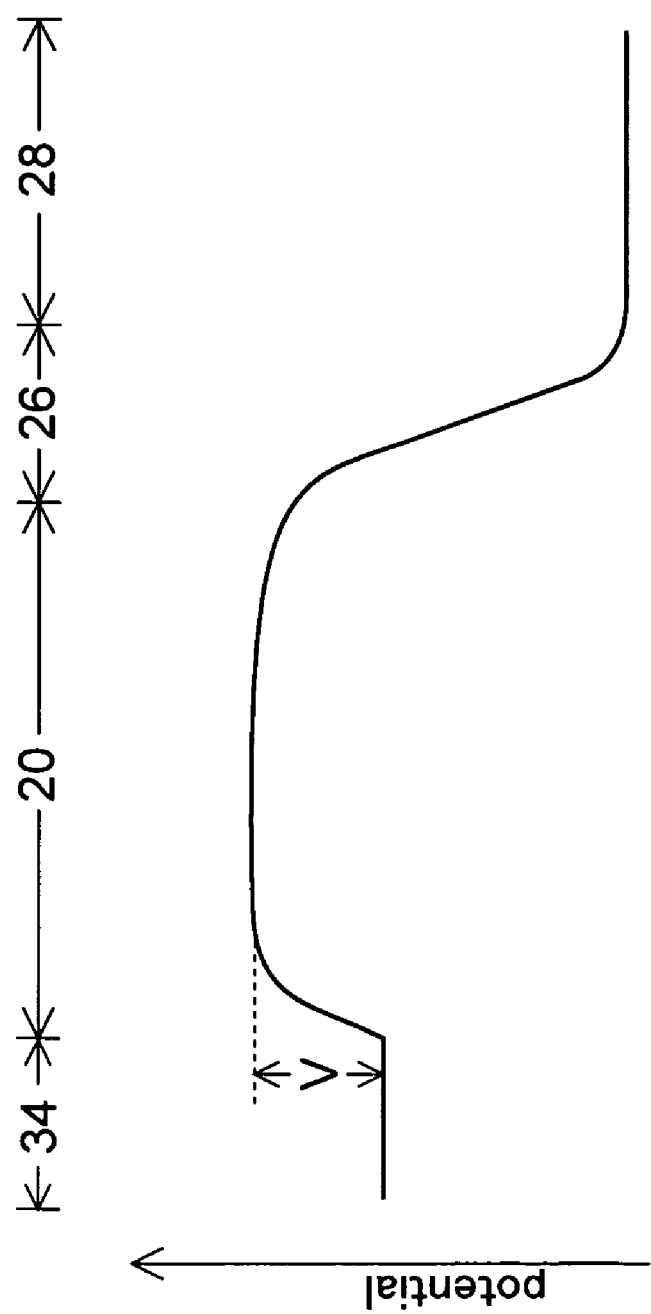
FIG. 9 is a diagram showing a height of a potential of the semiconductor device according to the first embodiment of the present invention.

FIG. 9 is a diagram showing a height of a potential for the electrons along the path Q in the case where the shallow n-well 34 is set to a ground potential and a high voltage (10V) is applied to the deep n-well 28.

In the above parasitic NPN bipolar transistor, the n-well 28 functions as a collector and the n-well 34 functions as an emitter.

Then, a base is configured of the p-type silicon substrate 20 and the p-well 26. P-type impurity concentration in the p-type silicon substrate 20 is low, while p-type impurity concentration in the p-well 26 is high. Therefore, as compared with a conventional example in which a base is configured only of a p-type silicon substrate having low impurity concentration, the impurity concentration of the base is increased in this embodiment. This heightens the height V of a potential barrier formed between the shallow n-well 34 and the substrate 20. Accordingly, only a slight flow of the base current $I_B$ does not greatly reduce electrons in the substrate 20 and does not make the potential barrier low. Thus, it is made possible to suppress an increase in the current amplification factor β of the parasitic NPN bipolar transistor, thereby suppressing latch-up in which a large current flows from the shallow n-well 34 to the deep p-well 28. Thus, it becomes possible to provide a semiconductor device with high reliability.

(2) Second Embodiment

Figure 10:
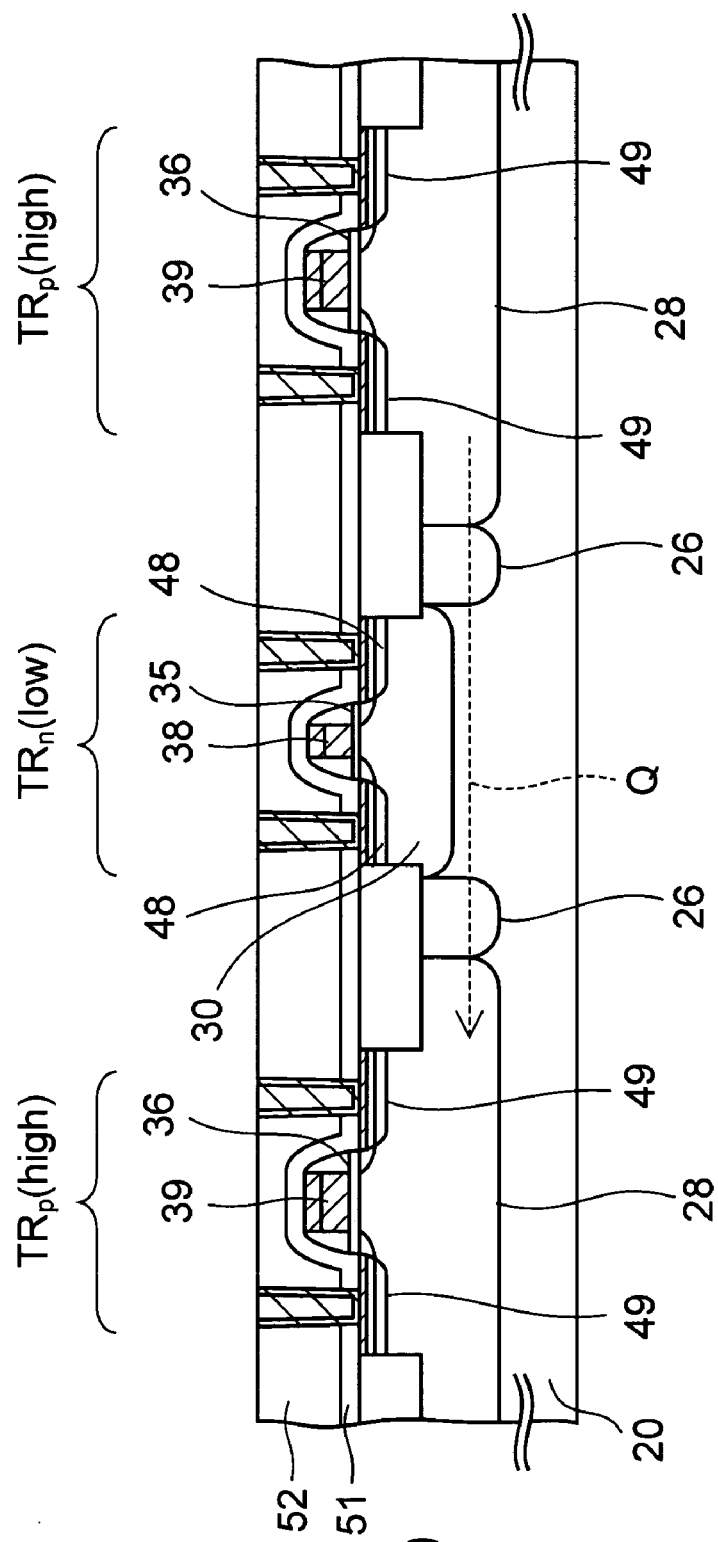
FIG. 10 is a cross-sectional view of a semiconductor device according to a second embodiment of the present invention.

FIG. 10 is a cross-sectional view of a semiconductor device according to the present embodiment. Note that in FIG. 10 the same reference numerals are given to the elements described in the first embodiment, and that the description thereof will be omitted.

In the first embodiment, as shown in FIG. 7K, the deep p-well 26 is formed only at one side of the shallow p-well 30 (at the deep n-well 28 side).

In contrast, in the present embodiment, as shown in FIG. 10, p-wells 26 are formed on both sides of the shallow p-well 30. In addition, a deep n-well 28 is formed in place of the shallow n-well 34 of the first embodiment. Further, a high-voltage p-type MOS transistor $TR_p$(high) is formed on the n-well 28.

When the deep p-wells 26 are formed on both sides of the shallow p-well 30 as described above, the two deep p-wells 26 further increase the impurity concentration of the base of a parasitic NPN bipolar transistor formed along a path Q. This makes it more difficult that a current amplification factor β of the above bipolar transistor increases, thereby effectively preventing the punch through.

(3) Third Embodiment

Figure 11:
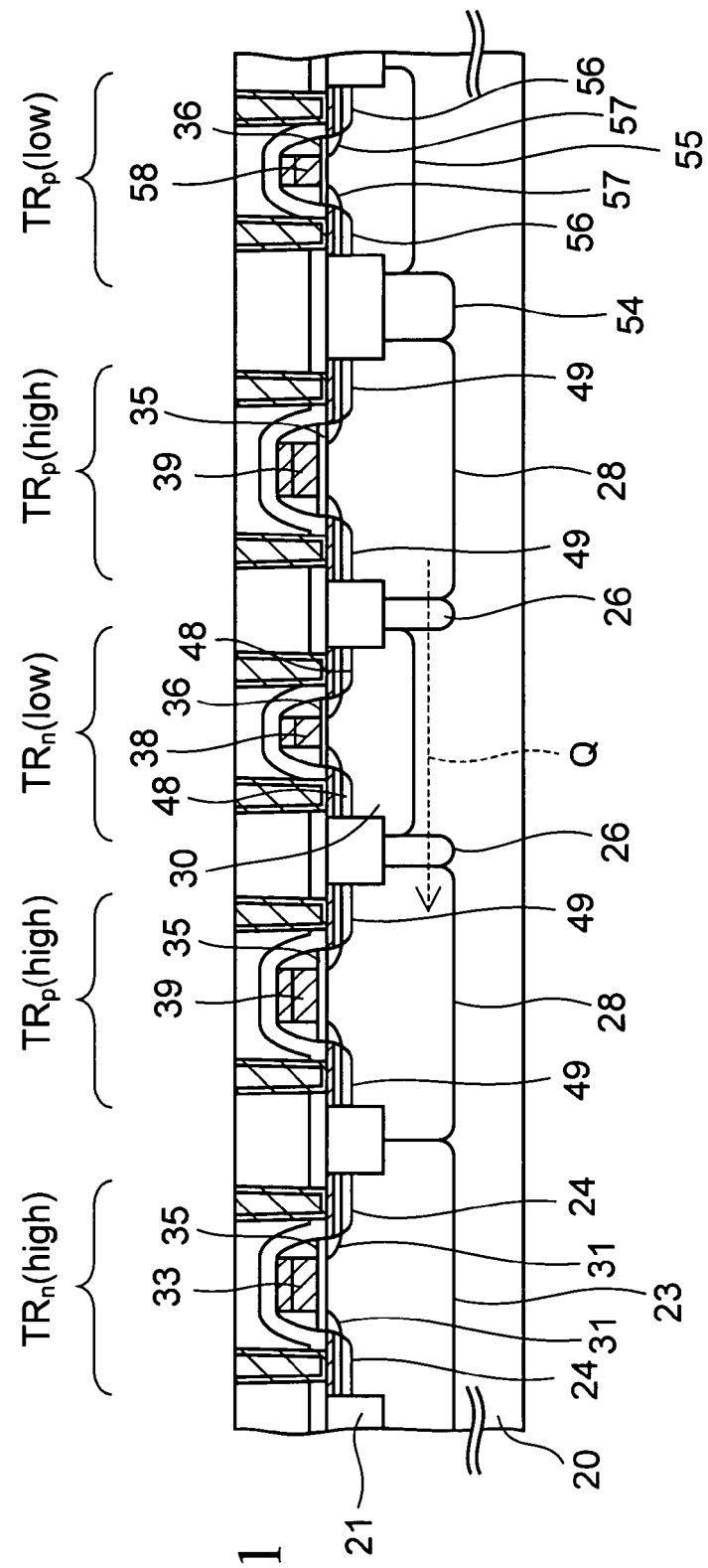
FIG. 11 is a cross-sectional view of the semiconductor device according to a third embodiment of the present invention.

FIG. 11 is a cross-sectional view of a semiconductor device according to a third embodiment of the present invention. Note that, in FIG. 11, the same reference numerals are given to the elements described in the first embodiment, and that the description thereof will be omitted.

The present embodiment is different from the second embodiment in that a high-voltage n-type MOS transistor $TR_n$(high) is formed next to a high-voltage p-type MOS transistor $TR_p$(high) located on the left side in FIG. 11, and that each of the high-voltage transistors has a Complementary Metal Oxide Semiconductor (CMOS) structure. In addition, the present embodiment is different from the first embodiment in that a low-voltage p-type MOS transistor $TR_p$(low) is formed next to a high-voltage p-type MOS transistor $TR_p$(high) located on the right side in FIG. 11.

Among these, the high-voltage n-type MOS transistor $TR_n$(high) is mainly formed of a deep p-well (a fifth well) 23, n-type source/drain extensions 31, n-type source/drain regions 24, a fourth gate electrode 33, and a first gate insulating film 35.

In addition, the low-voltage p-type MOS transistor $TR_p$(low) is mainly formed by a shallow n-well (a sixth well) 55, p-type source/drain extensions 57, p-type source/drain regions 56, a fifth gate electrode 58, and a second gate insulating film 36.

Moreover, an isolation p-well 54 is formed between the shallow n-well 55 and the deep n-well 28 in order to electrically isolate these wells.

Figure 12:
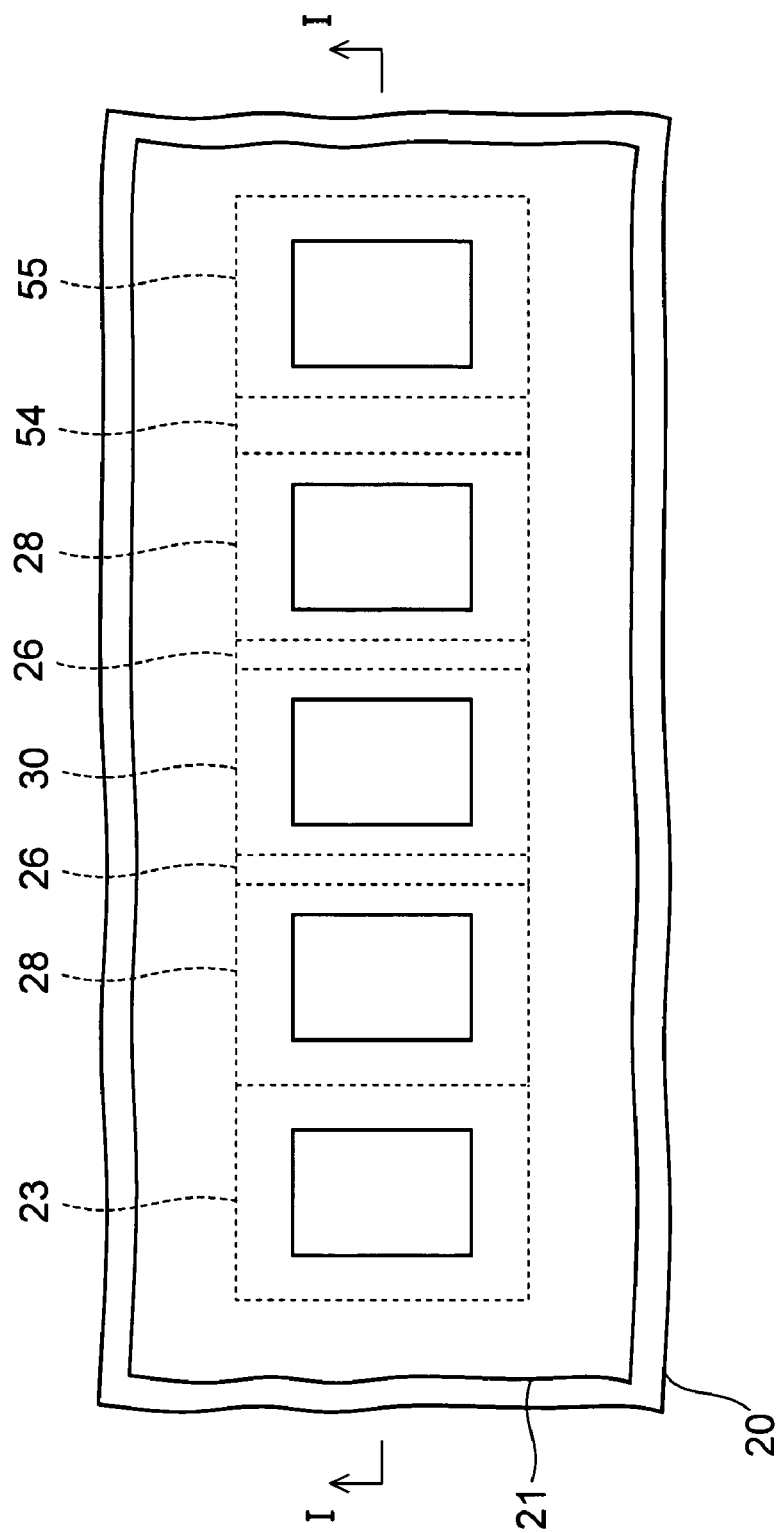
FIG. 12 is a diagram showing a planar layout of a well of the semiconductor device according to the third embodiment of the present invention.

Note that FIG. 12 is a plan view showing a planar layout of the wells, and the above-mentioned FIG. 11 corresponds to a cross-sectional view taken along a I-I line in FIG. 12.

In the present invention, the isolation p-well 54 and the deep p-well 23 are simultaneously formed with the deep p-well 26 described in the first embodiment. Accordingly, in the case where each of the high-voltage p-type MOS transistor $TR_p$(high) and the high-voltage n-type MOS transistor $TR_n$(high) on the left side is configured of a CMOS structure, or in the case where the high-voltage p-type MOS transistor $TR_p$(high) and the low-voltage p-type MOS transistor $TR_p$(low) on the right side are isolated from each other by the isolation p-well 54, latch-up along a path Q can be suppressed, as in the case of the second embodiment, without carrying out an additional new step for forming the deep p-well 26.

(4) Fourth Embodiment

Figure 13:
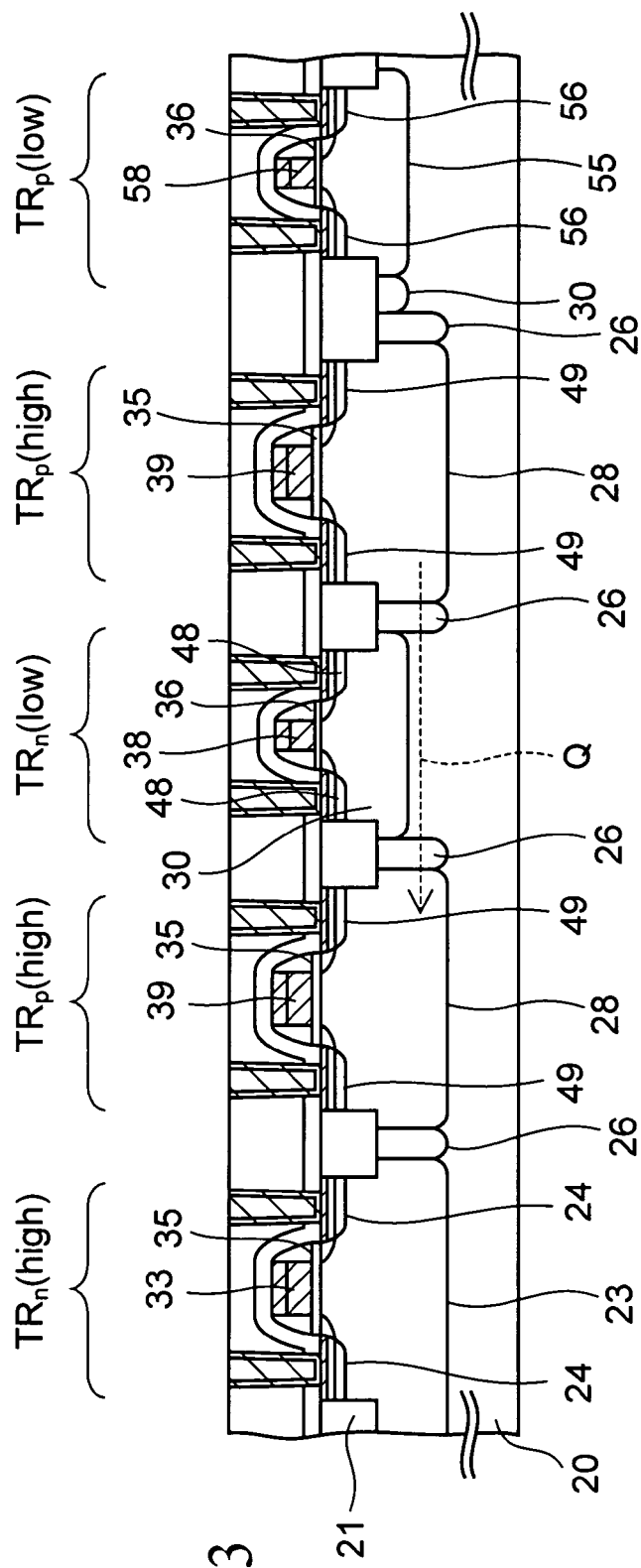
FIG. 13 is a cross-sectional view of the semiconductor device according to a fourth embodiment of the present invention.

FIG. 13 is a cross-sectional view of a semiconductor device according to the present invention. Note that, in FIG. 13, the same reference numerals are given to the elements described in the third embodiment, and that the description thereof will be omitted below.

Figure 14:
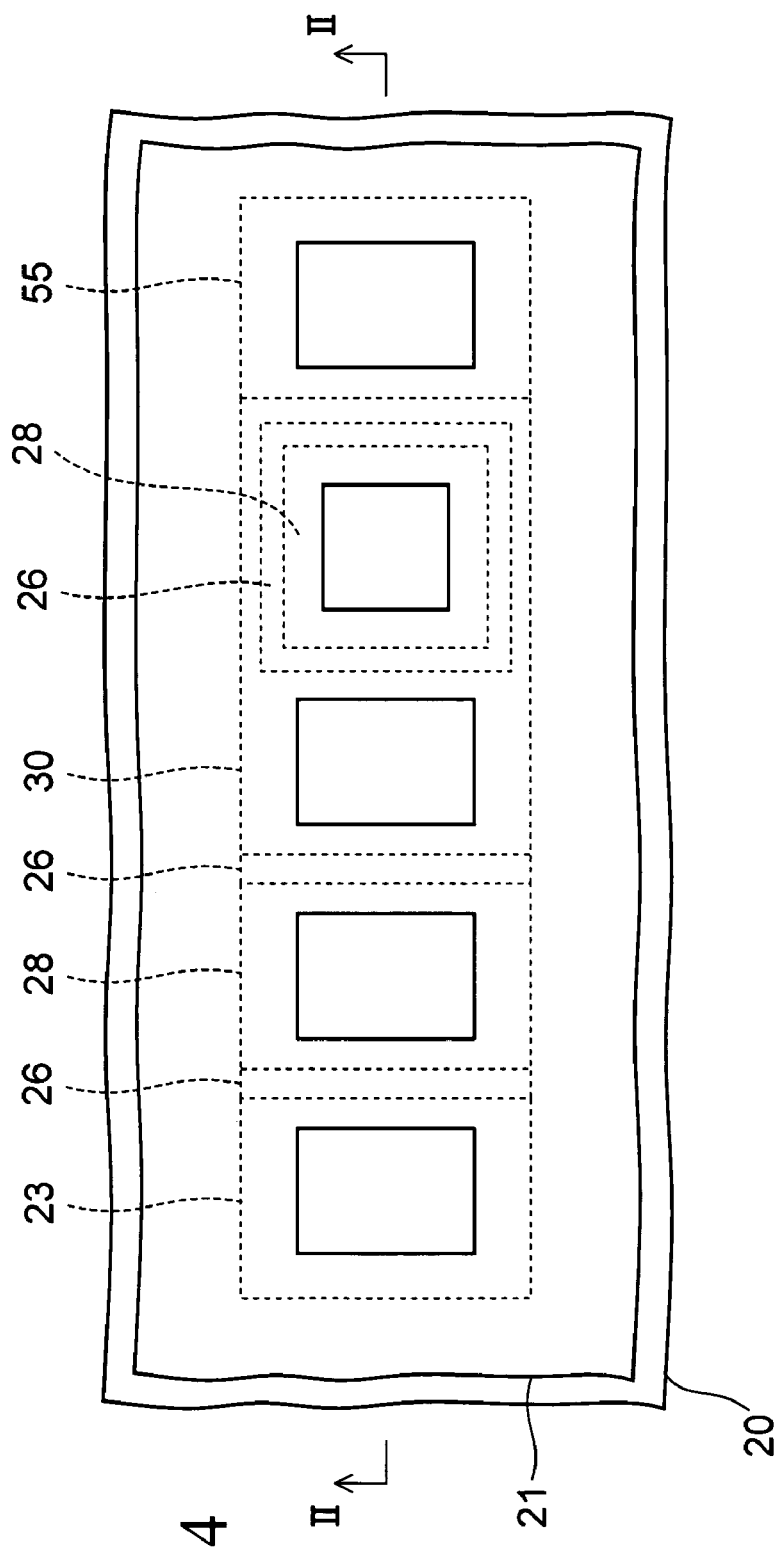
FIG. 14 is a diagram showing a planar layout of a well of the semiconductor device according to the fourth embodiment of the present invention.

In addition, FIG. 14 is a plan view showing a planar layout of wells in the semiconductor device, and the above-mentioned FIG. 13 corresponds to a cross-sectional view taken along a II-II line in FIG. 14.

As shown in FIG. 14, the present embodiment is different from the third embodiment in that the deep p-well 26 and the shallow p-well 30 surround a deep n-well 28, thereby eliminating the isolation p-well 54 (see, FIG. 12) which is used for electrically isolating the deep n-well 28 from the shallow n-well 55.

In the present embodiment, the deep p-well 23 and the deep p-well 26 are also simultaneously formed as in the case of the third embodiment. Accordingly, in the case where each of the high-voltage p-type MOS transistor $TR_p$(high) and the high-voltage n-type MOS transistor $TR_n$(high) on the left side in FIG. 13 is configured of a CMOS structure, there is no need to add a step for forming the deep p-well 26.

In addition, the deep p-well 26 makes it possible to suppress latch-up along a path Q likewise the third embodiment.

Furthermore, as shown in FIG. 14, since the deep p-well 26 is formed so as to surround the deep n-well 28, a planar layout of the deep p-well 26 can be obtained only by expanding the outline of the deep n-well 28. Accordingly, design data of the deep p-well 26 can be easily obtained from design data of the deep n-well 28. Thus, it does not take a time to design the deep p-well 26. This makes it possible to easily create a shielding pattern of a reticle (not shown) used for forming a resist pattern with which impurities are selectively implanted, thereby preventing manufacturing cost of a semiconductor device from being increased due to the formation of the deep p-well 26.

(5) Fifth Embodiment

Figure 15A:
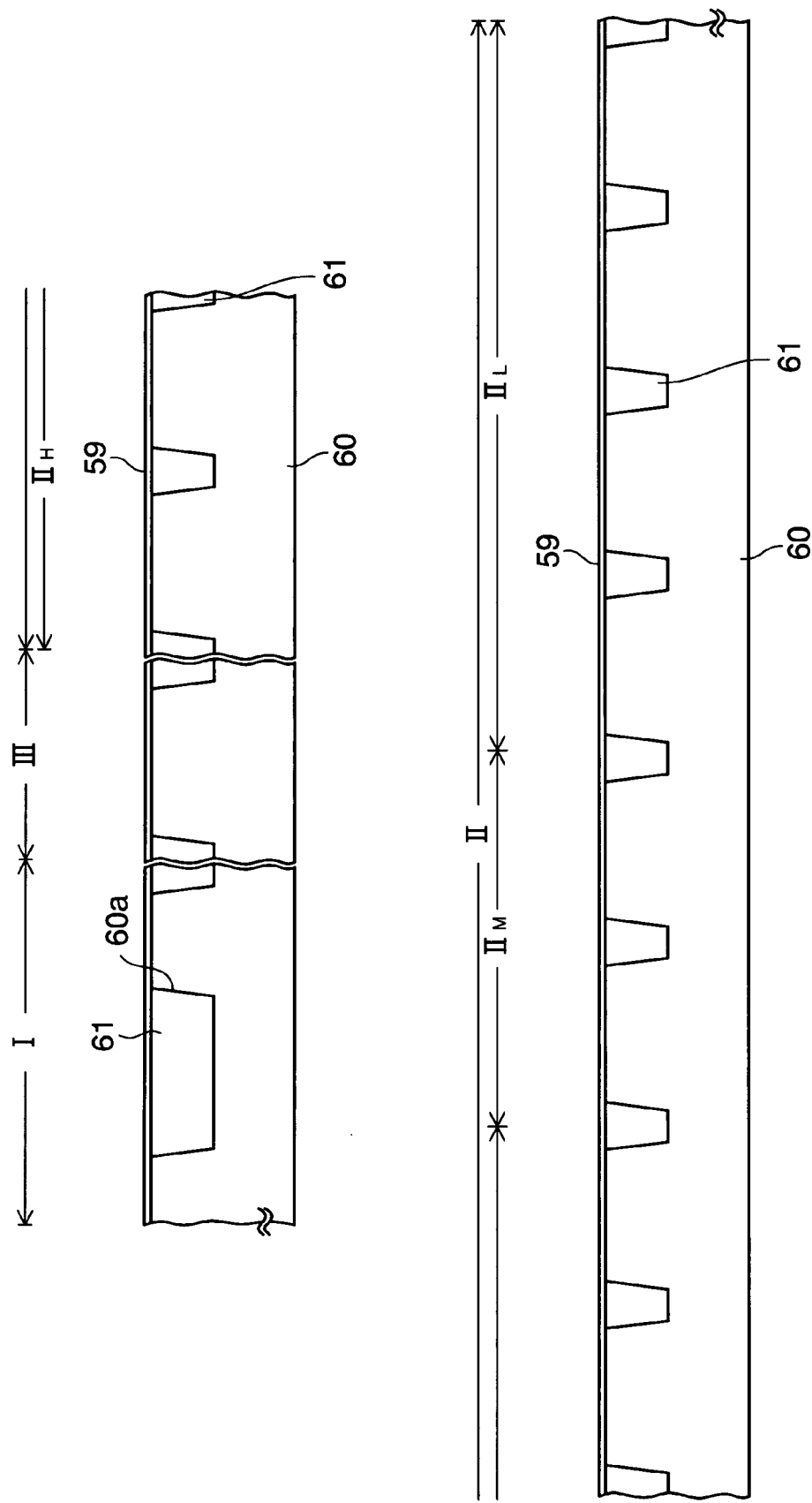
FIGS. 15A to 15W are cross-sectional views each showing a semiconductor device in the middle of manufacturing according to a sixth embodiment of the present invention.
Figure 15B:
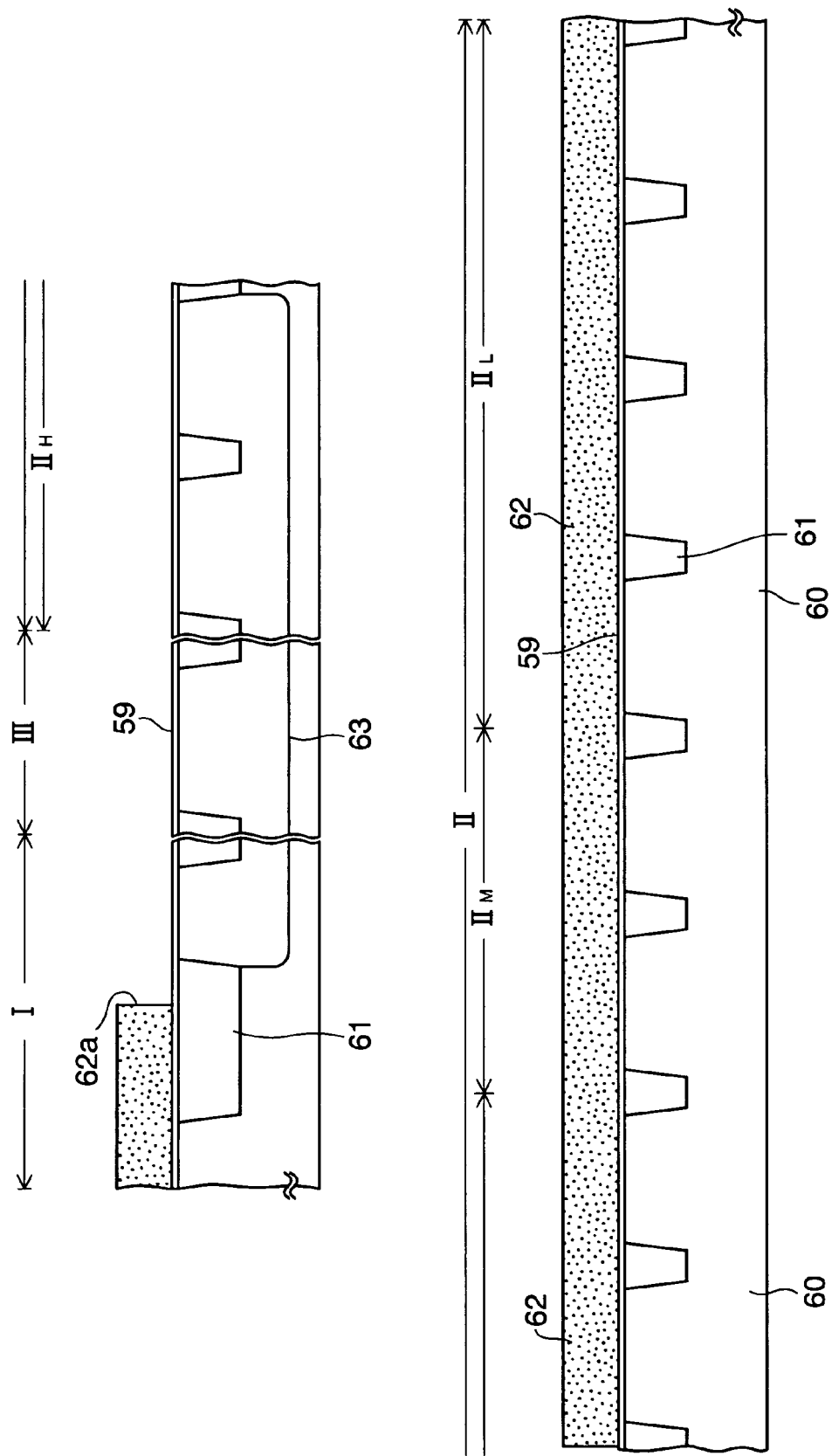
Figure 15C:
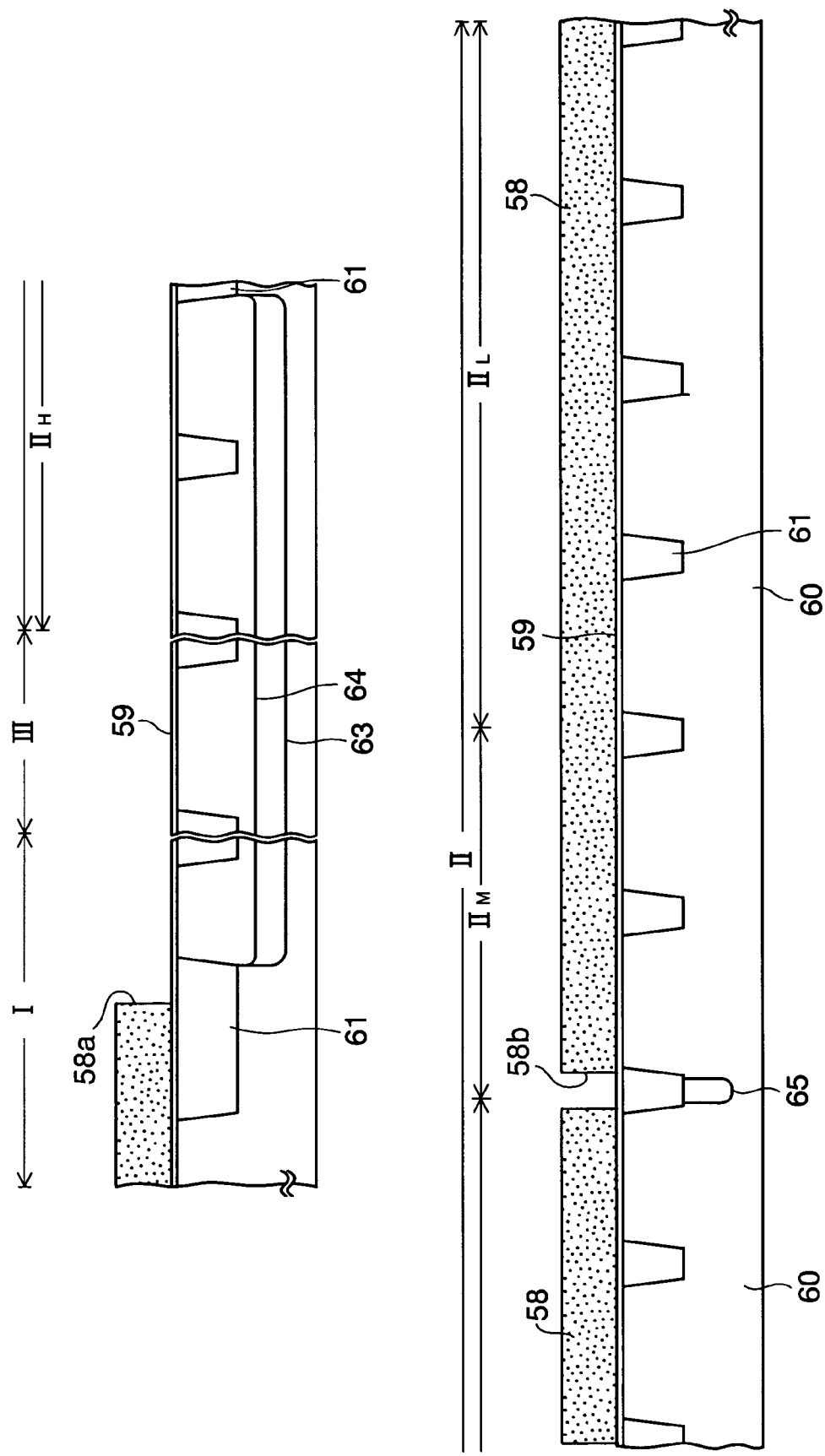
Figure 15D:
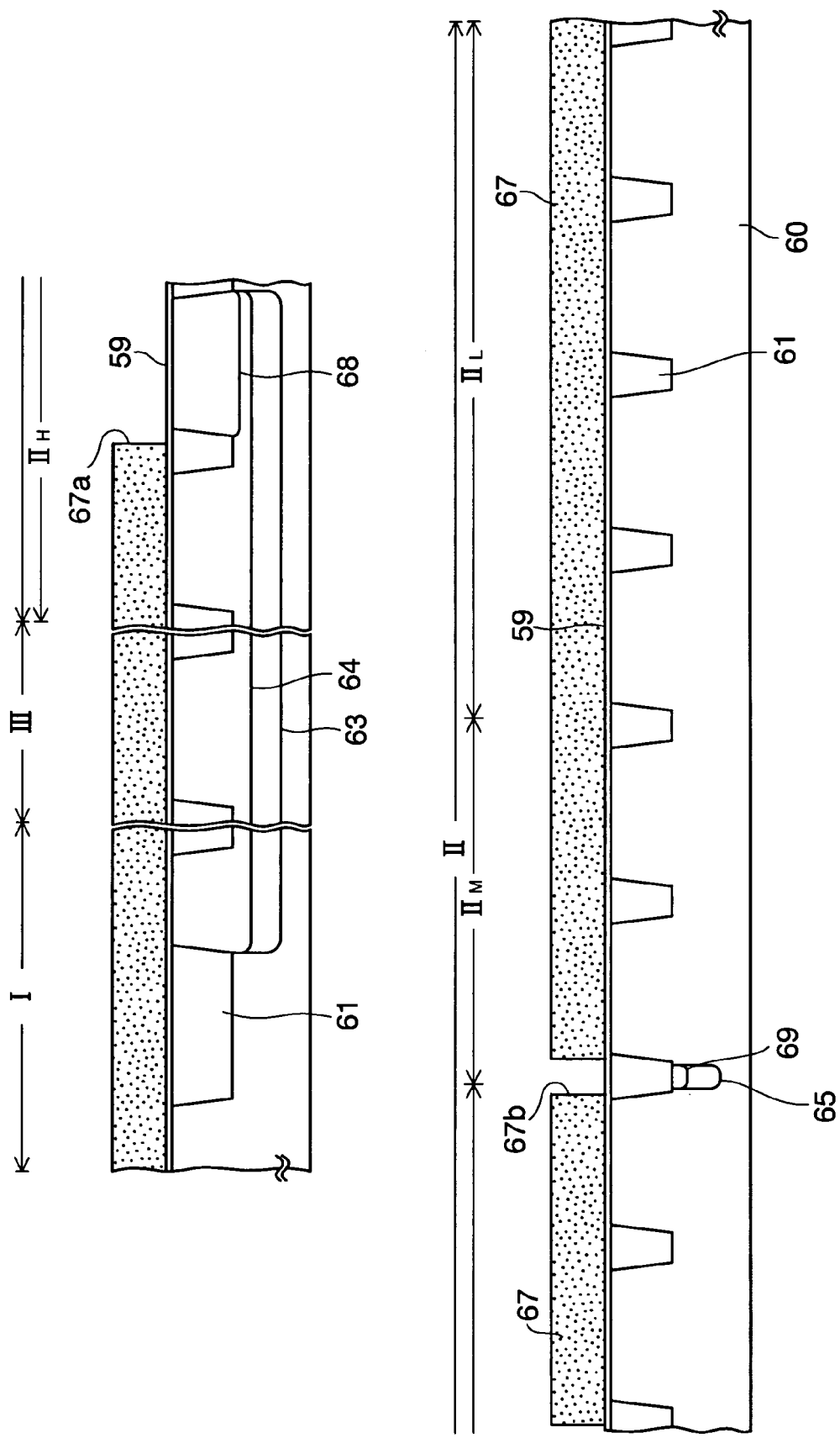
Figure 15E:
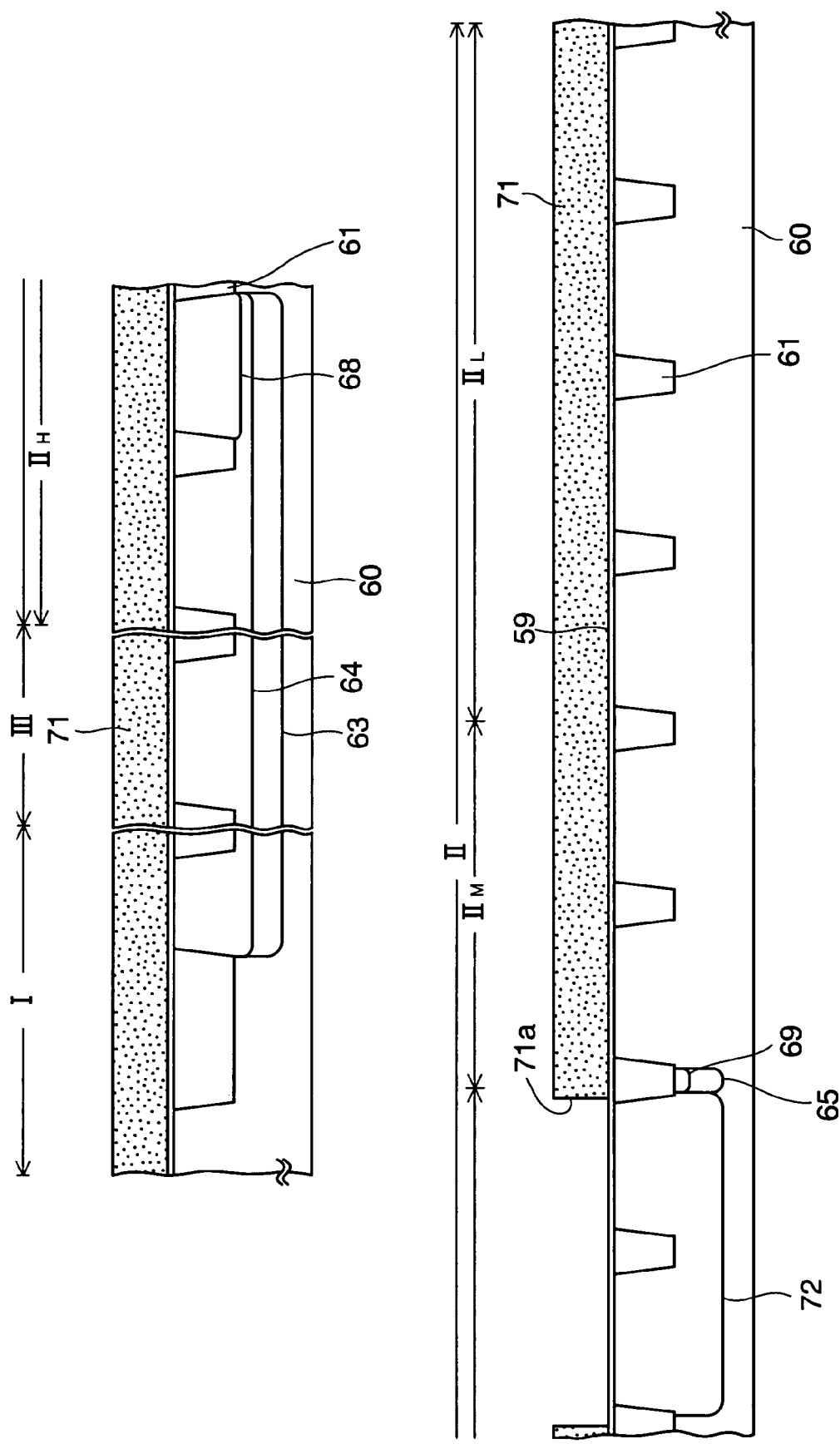
Figure 15F:
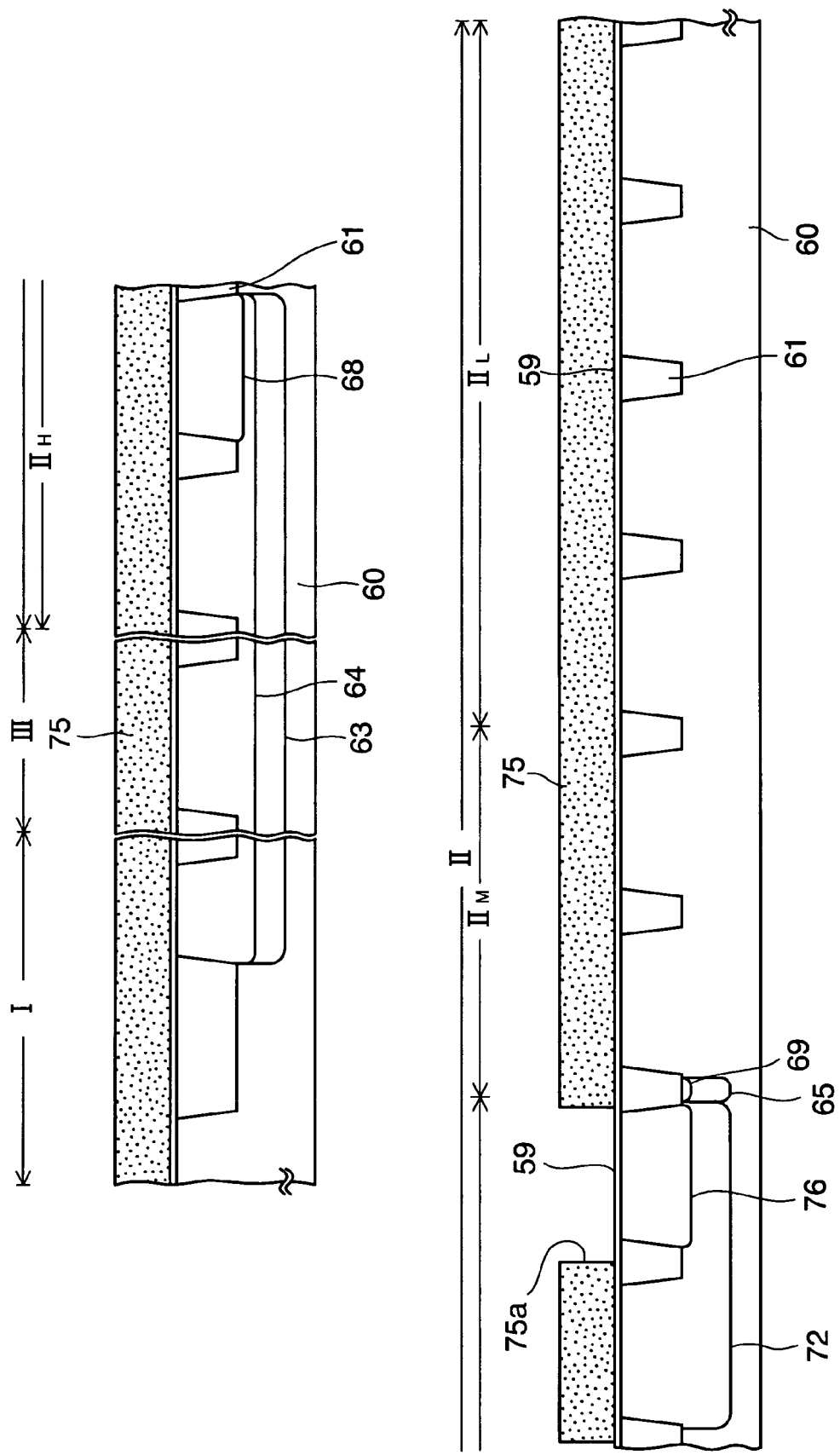
Figure 15G:
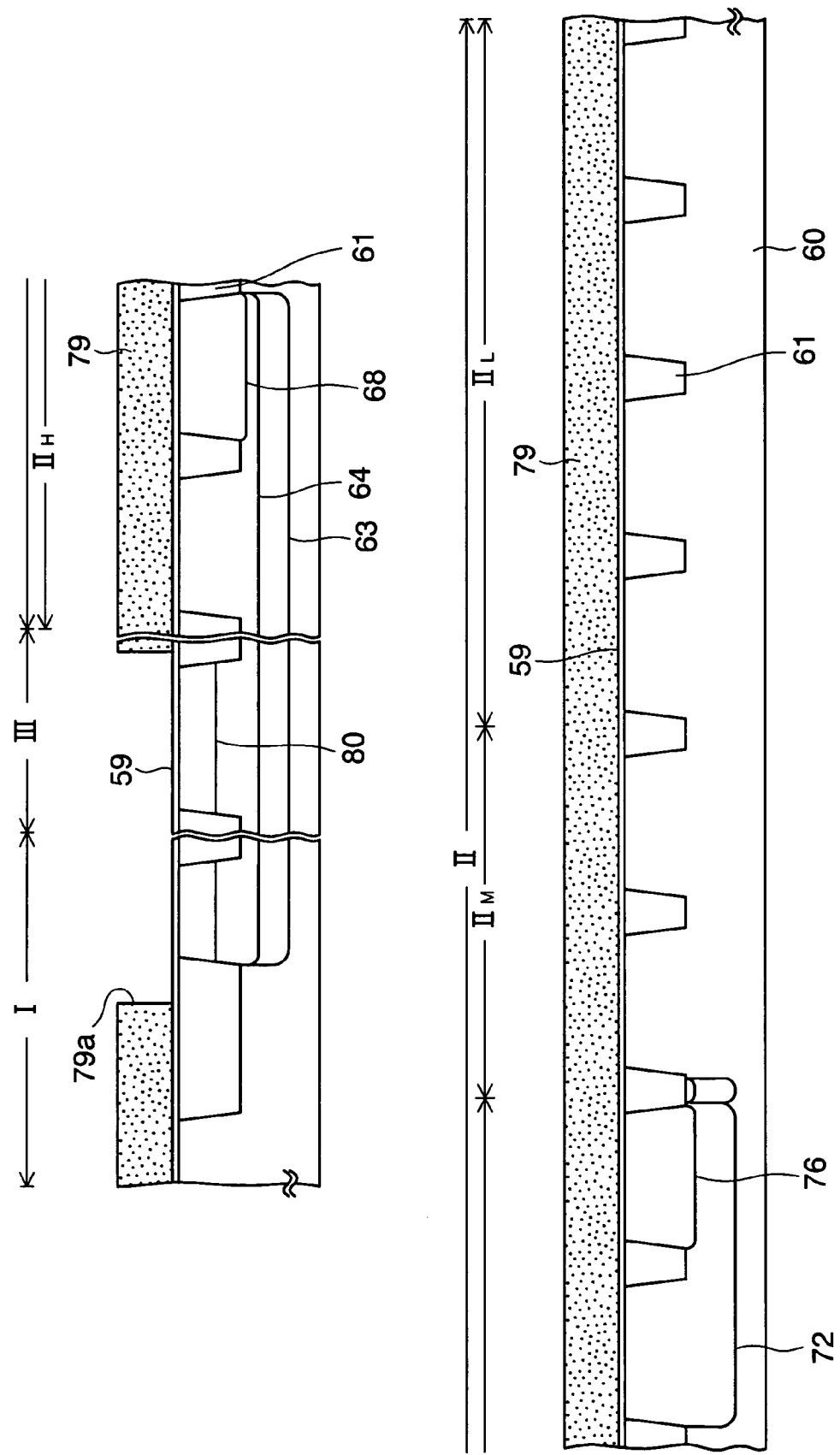
Figure 15H:
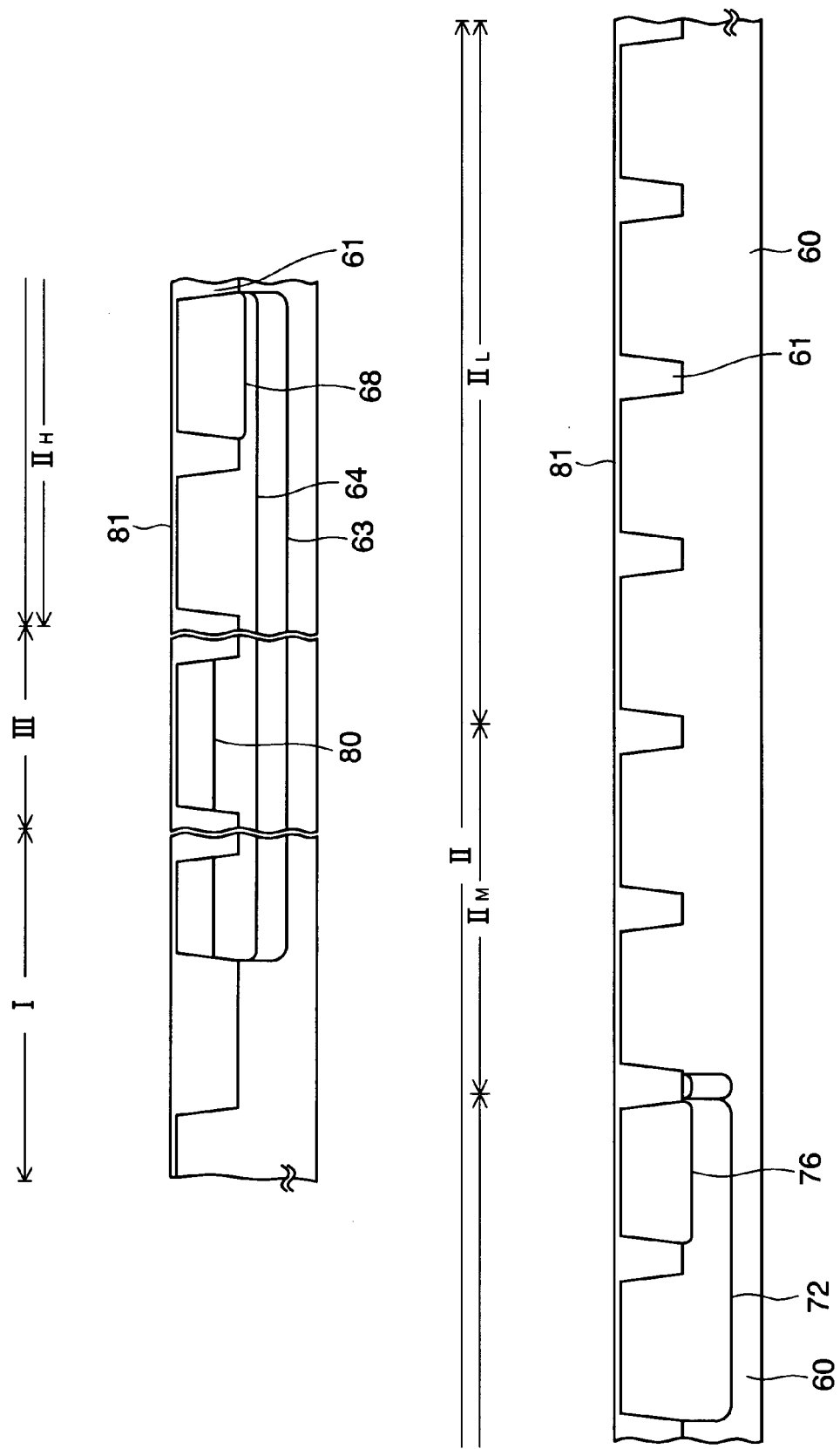
Figure 15I:
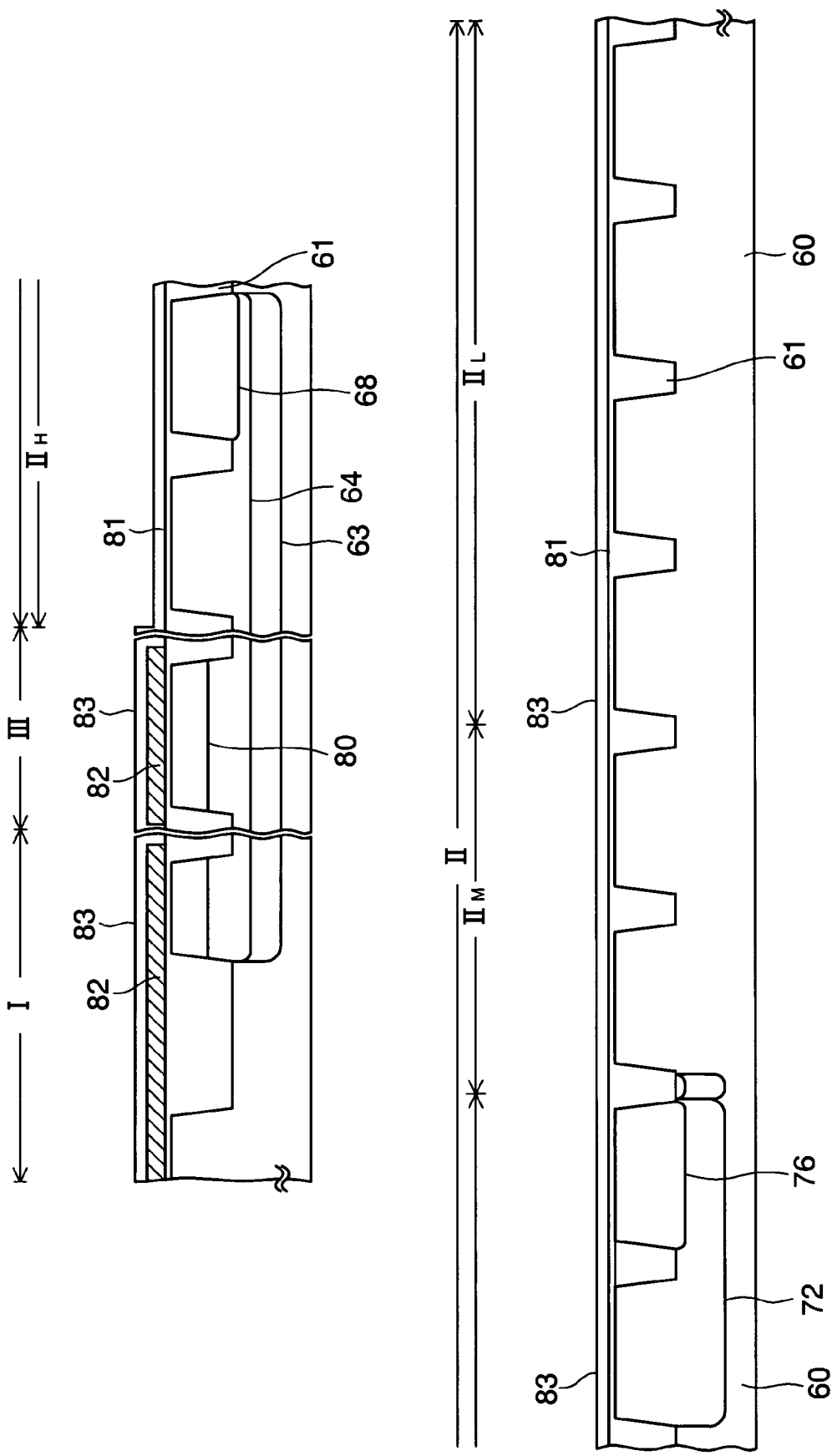
Figure 15J:
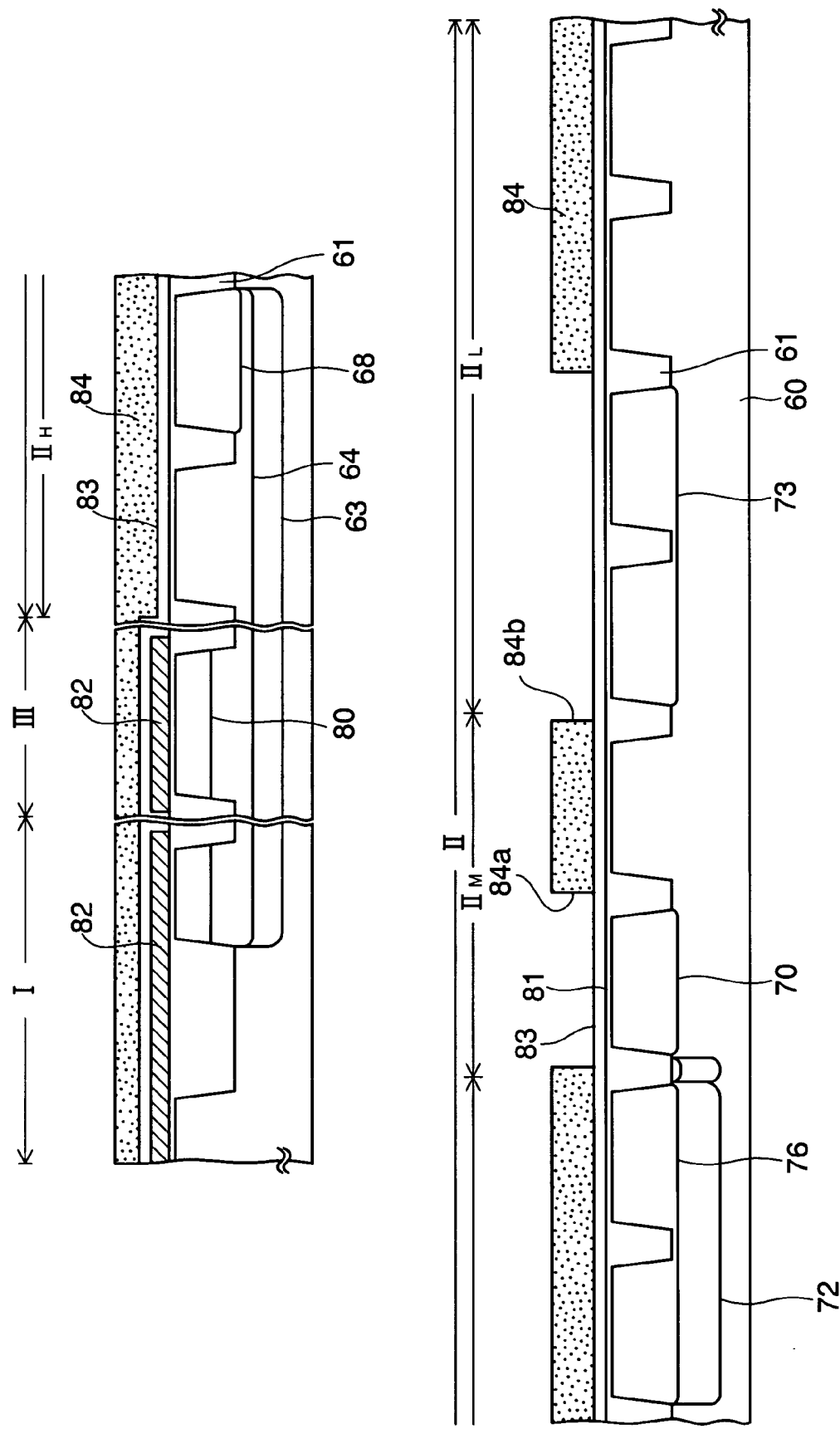
Figure 15K:
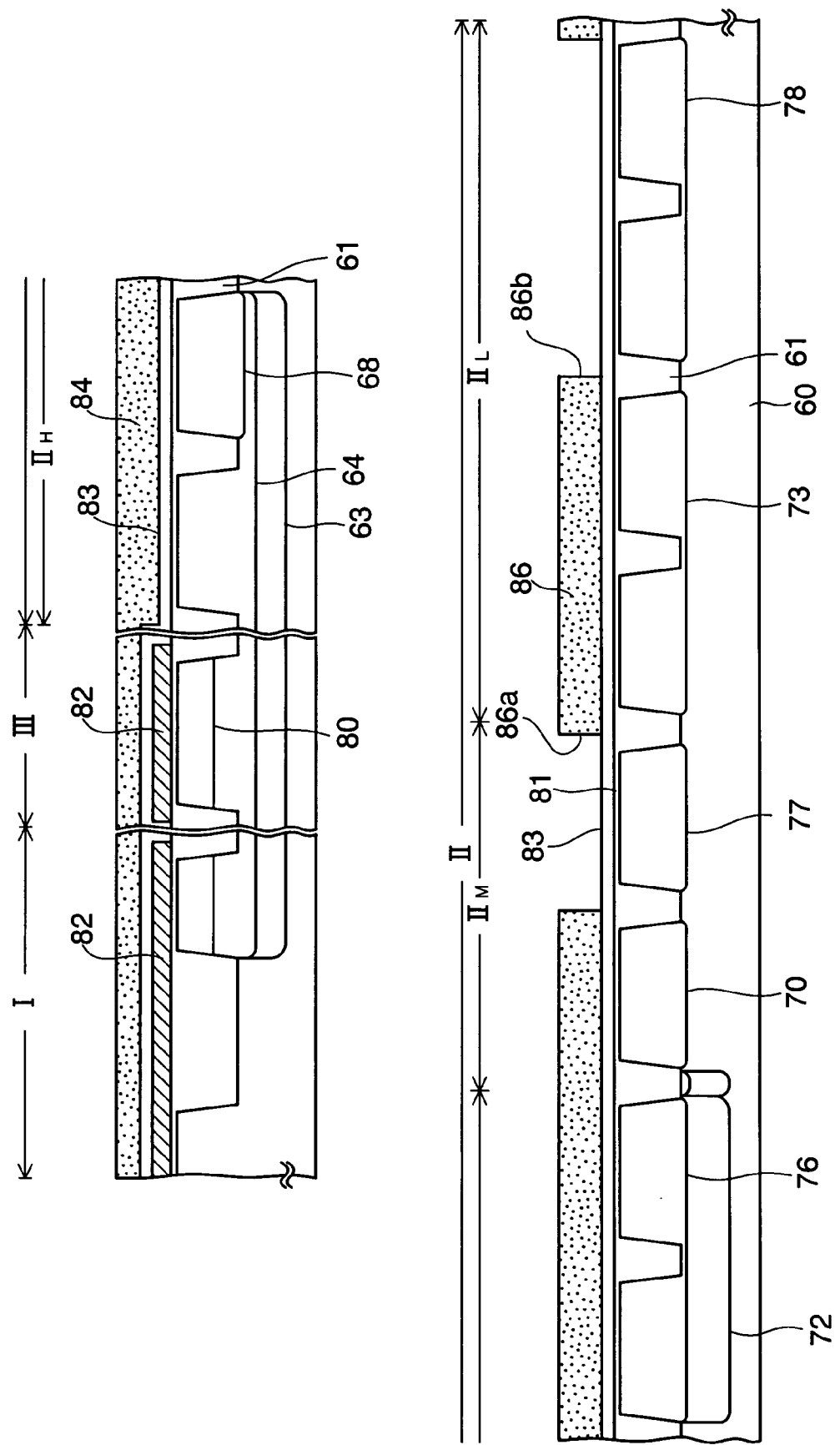
Figure 15L:
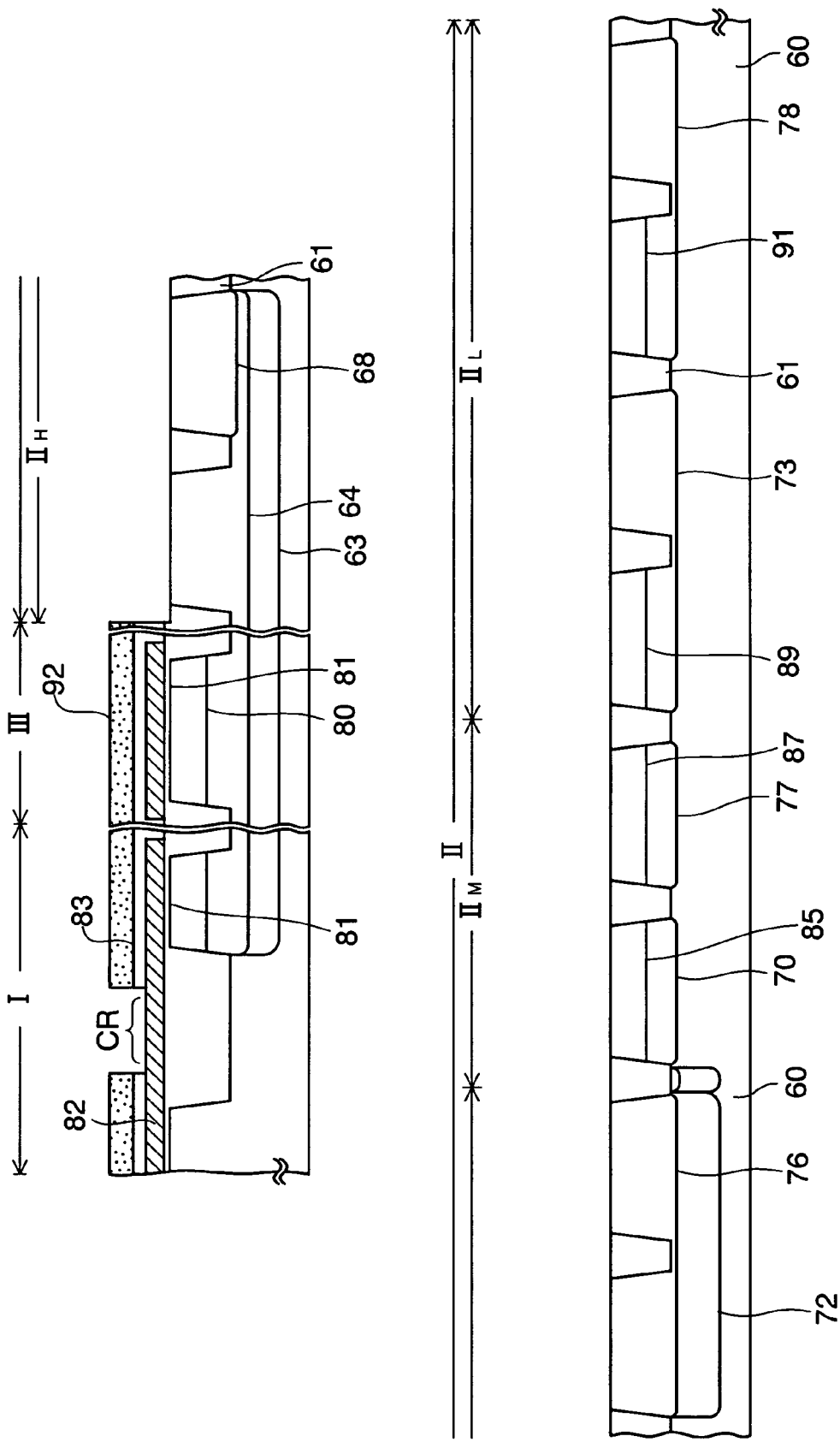
Figure 15M:
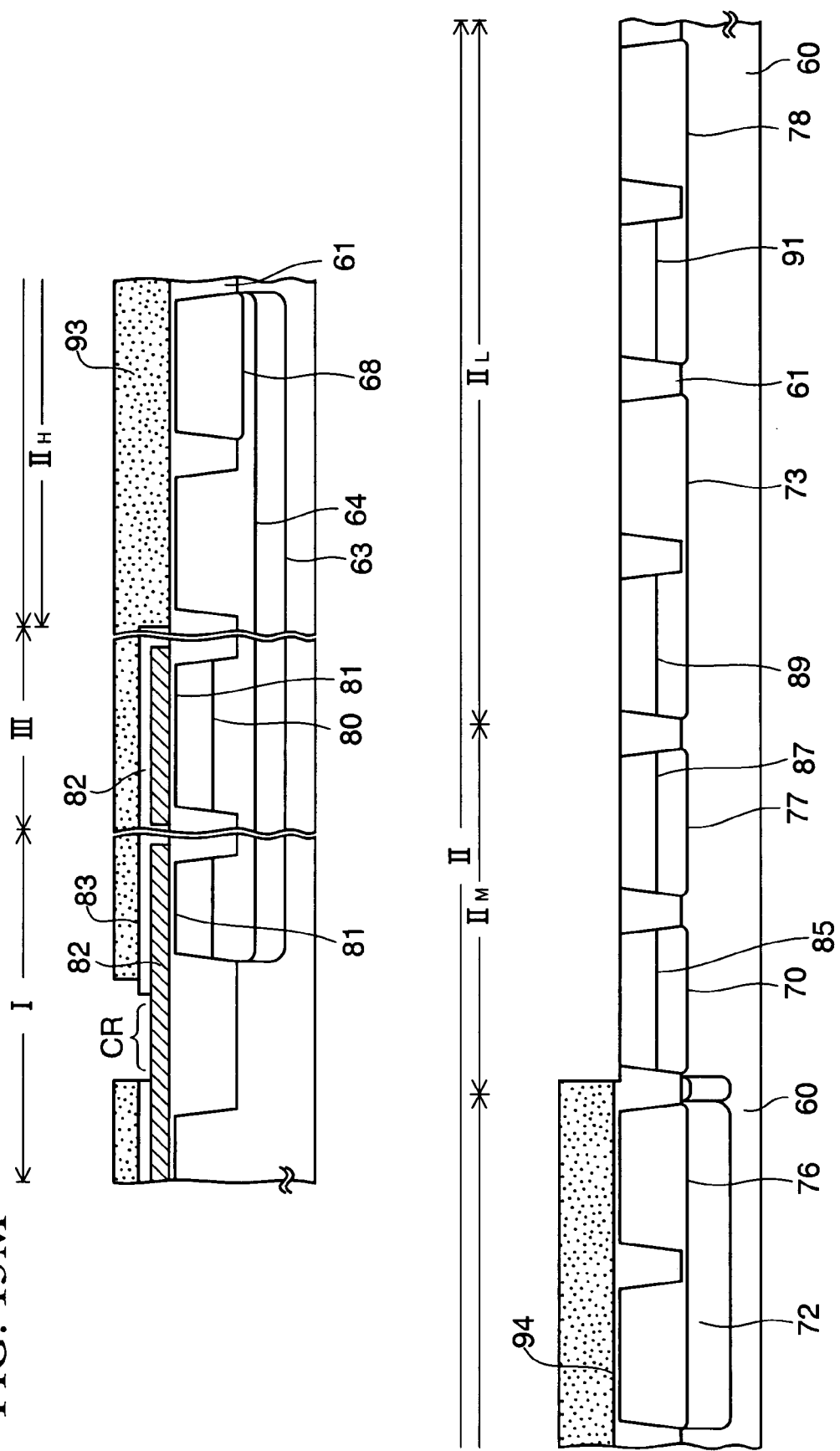
Figure 15N:
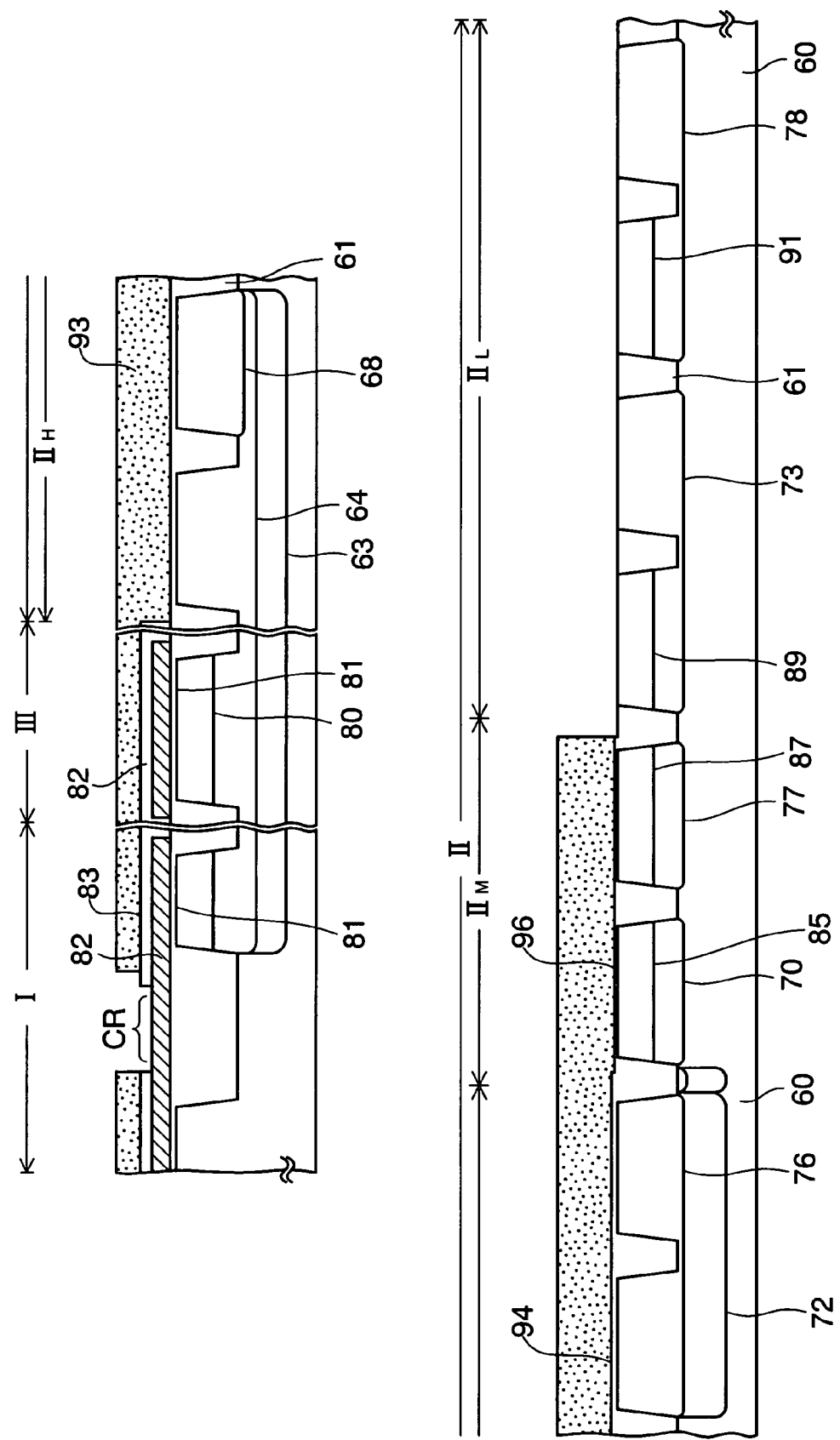
Figure 15O:
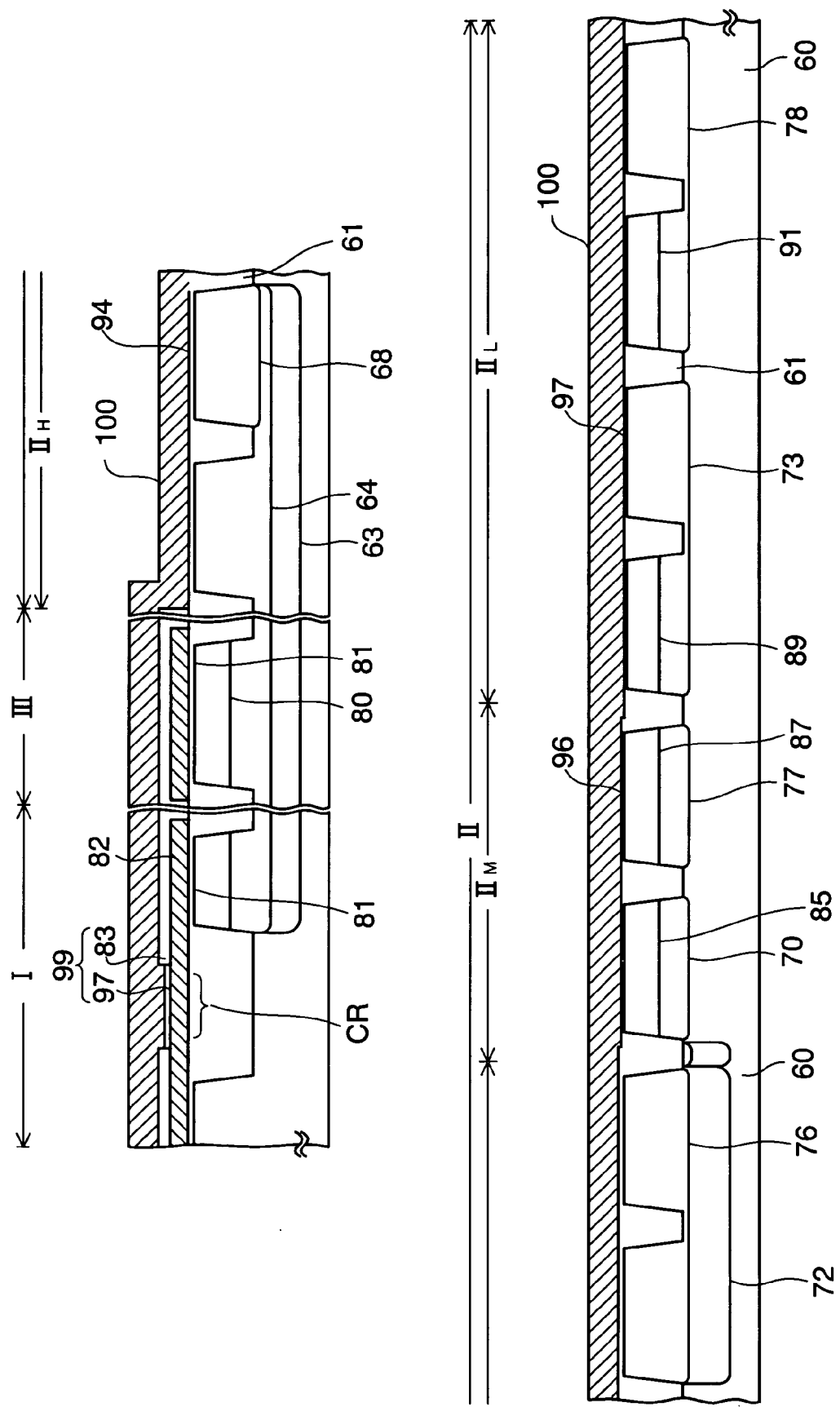
Figure 15P:
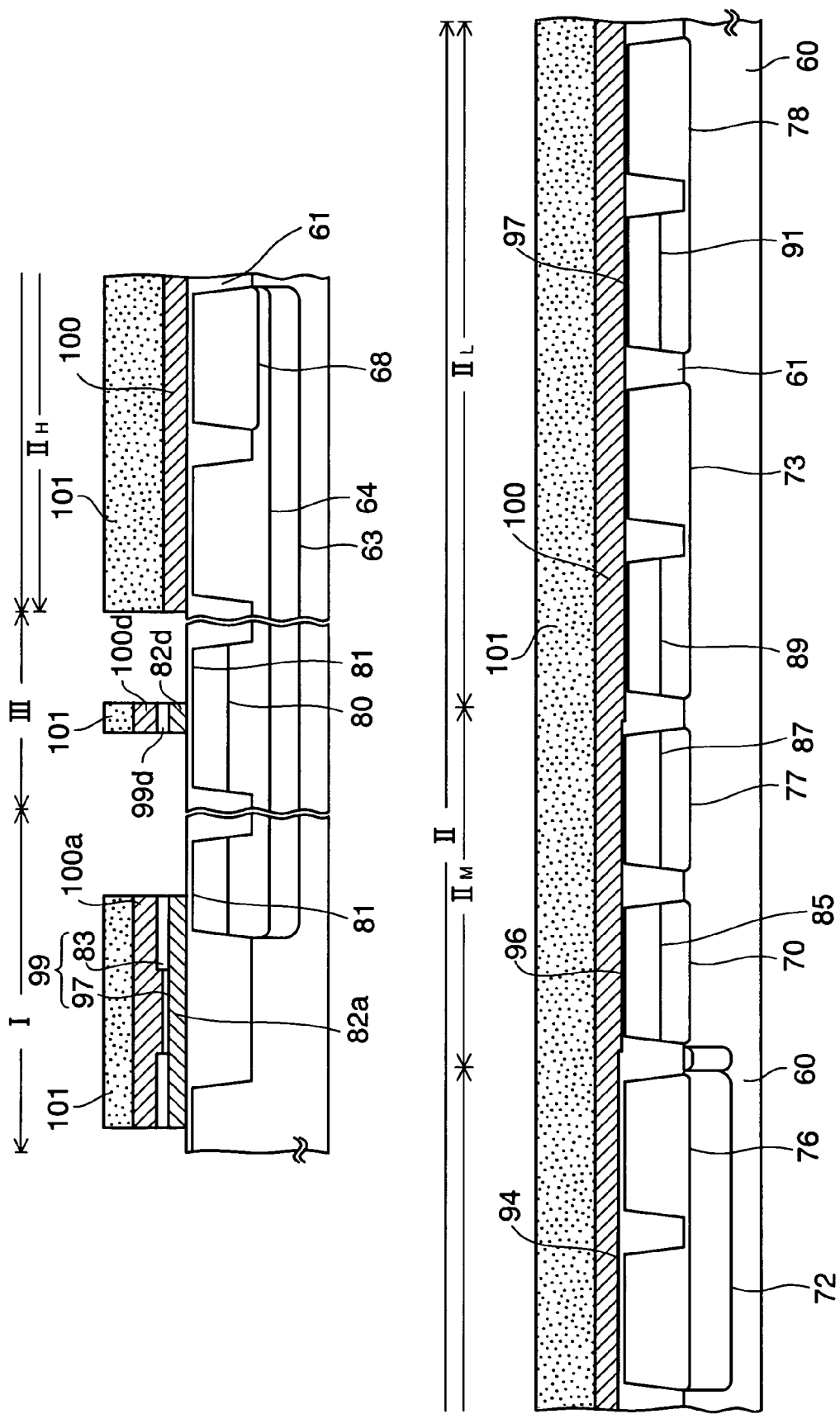
Figure 15Q:
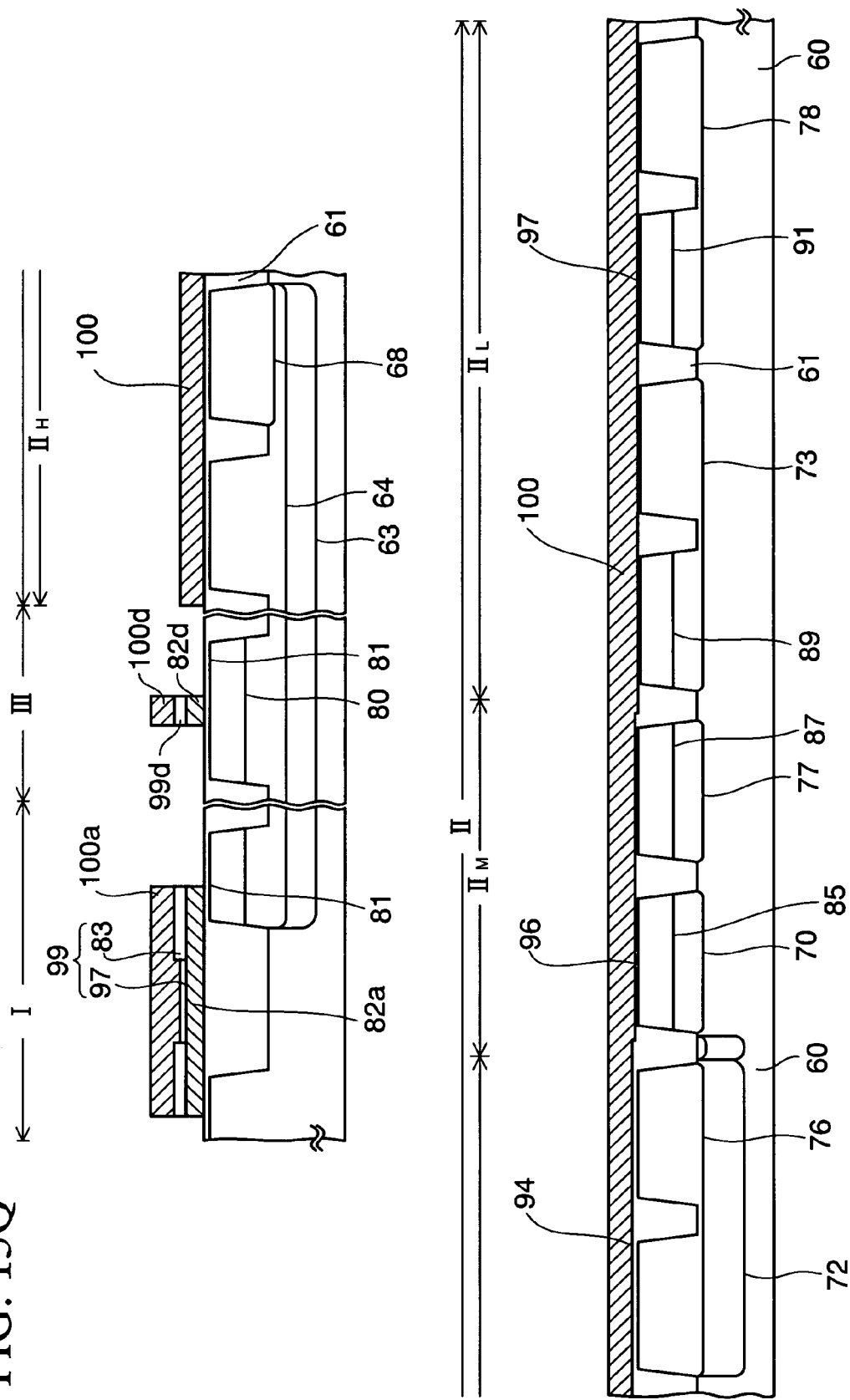
Figure 15S:
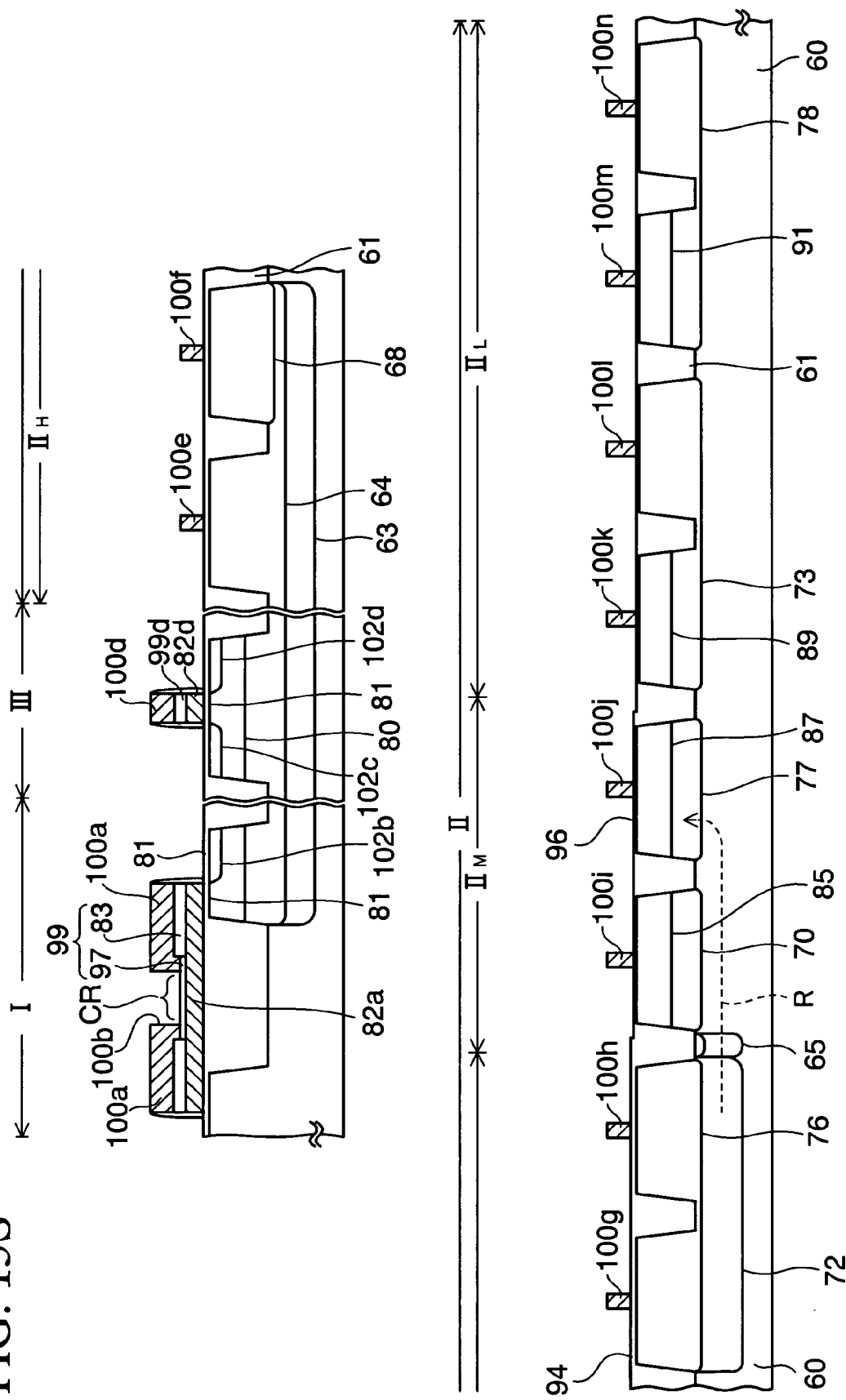
Figure 15T:
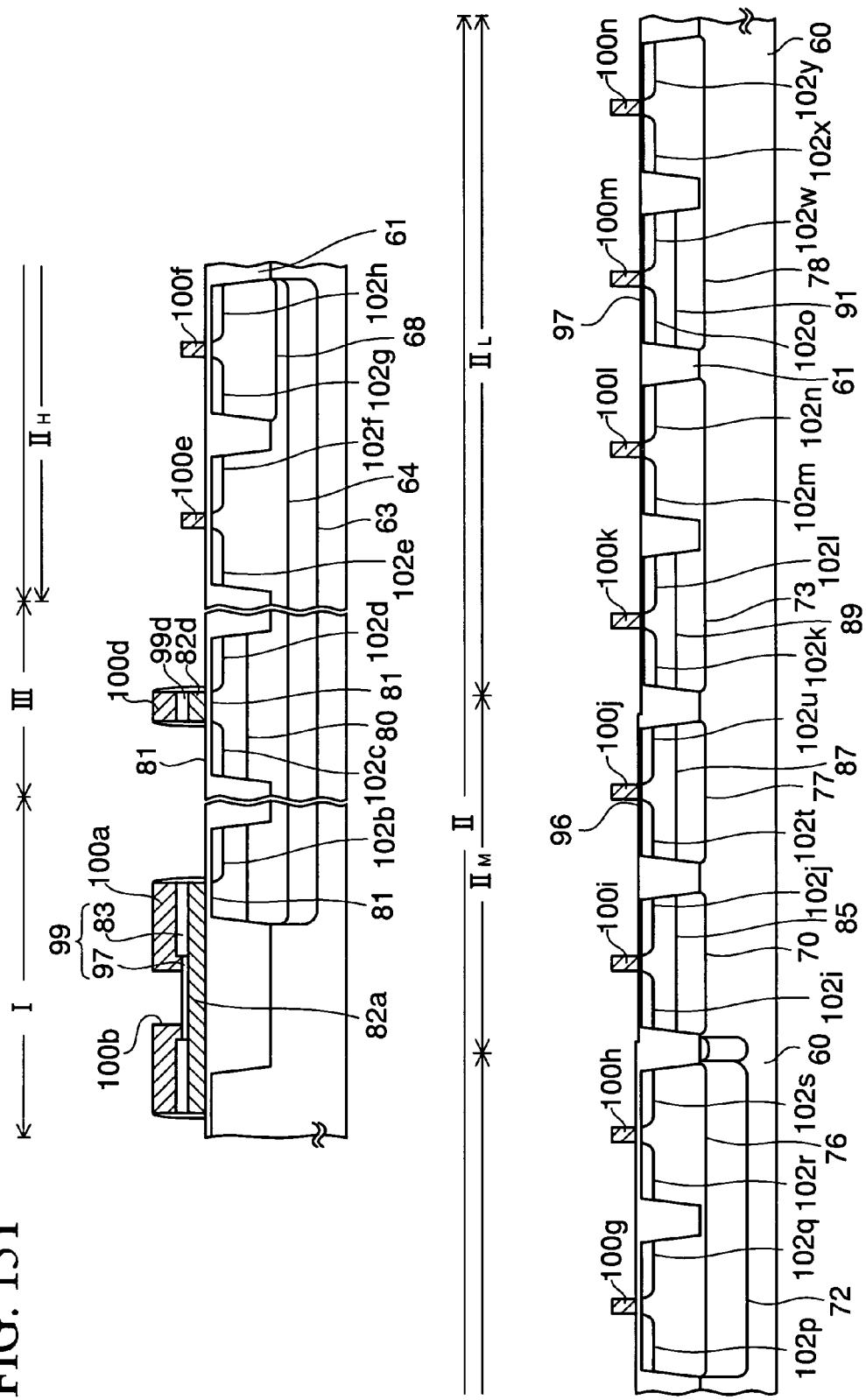
Figure 15U:
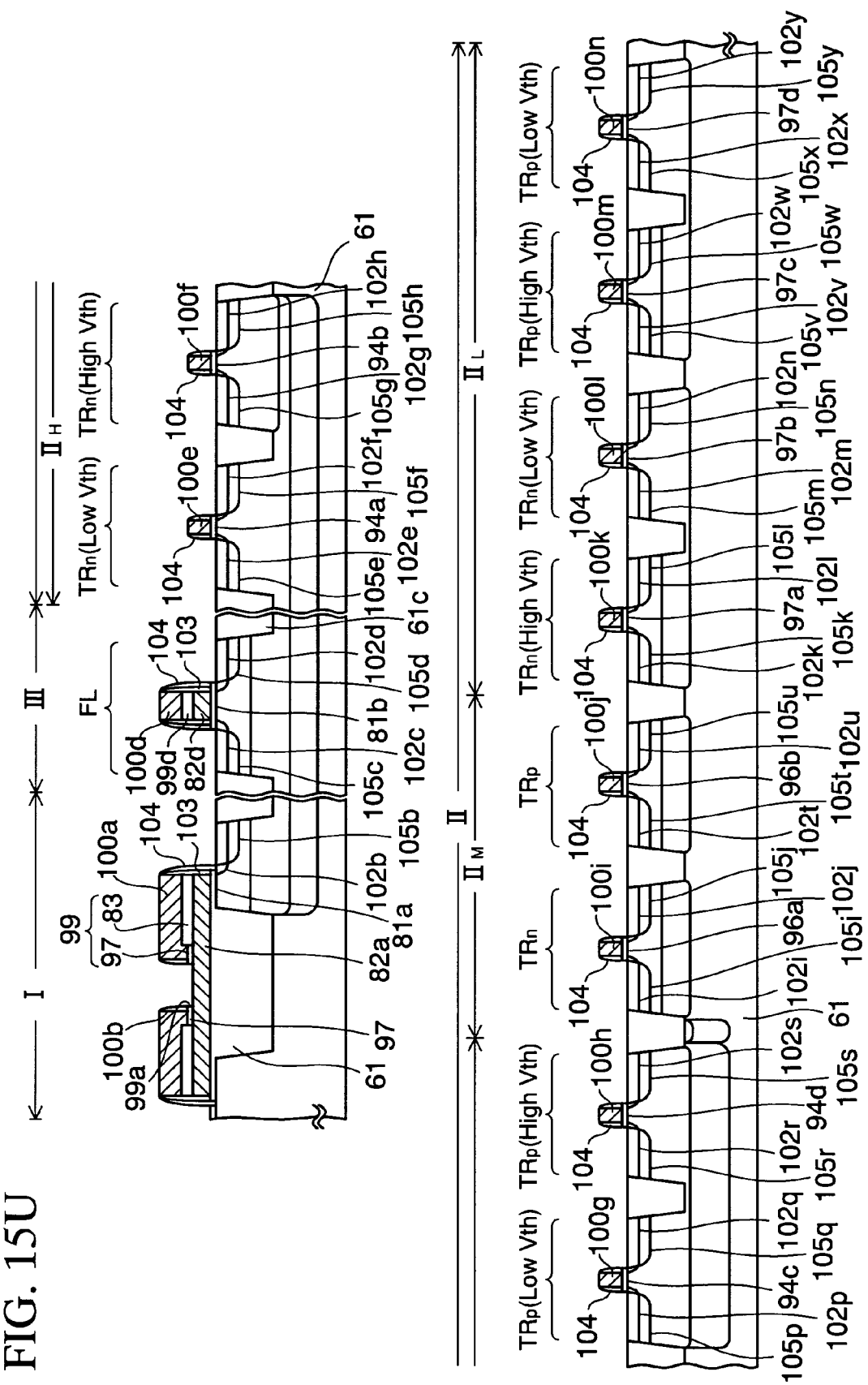
Figure 15V:
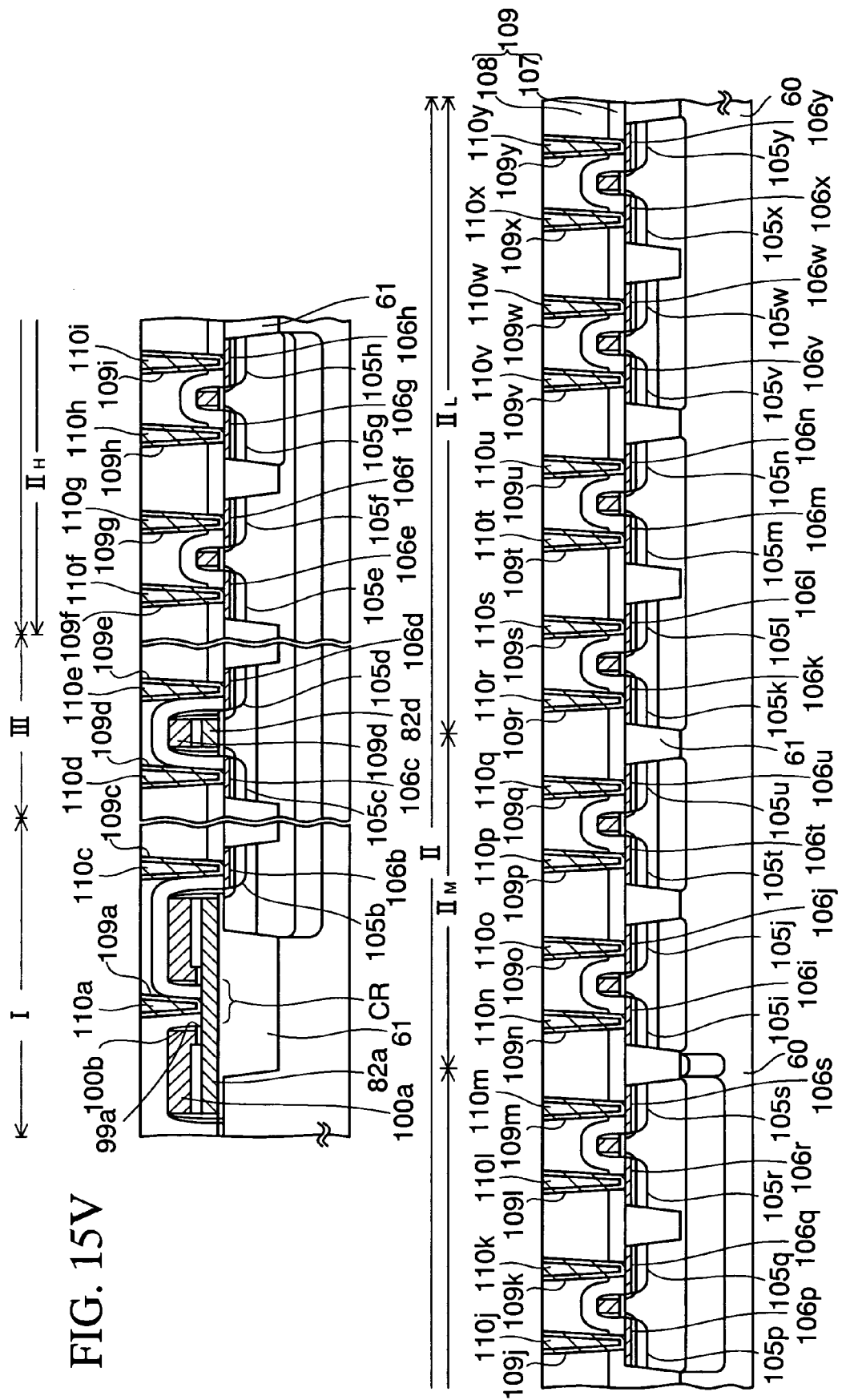
Figure 15W:
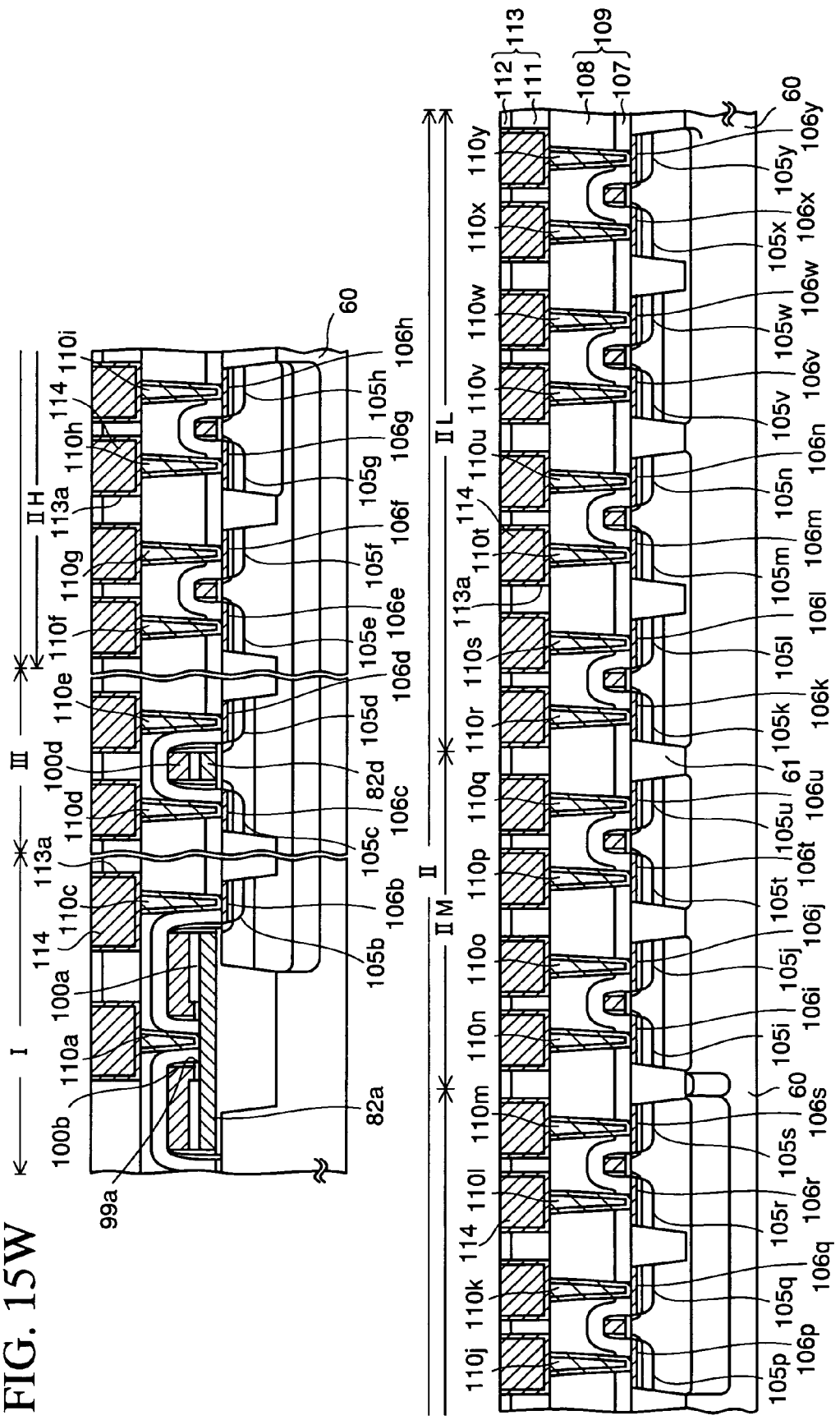

FIGS. 15A to 15W are cross-sectional views each showing a semiconductor device in the middle of manufacturing a semiconductor device according to a fifth embodiment of the present invention.

In the present embodiment, a Field Programmable Gate Array (FPGA) is manufactured. The FPGA is configured by merging a flash memory and a logic circuit.

Firstly, steps for obtaining a cross-sectional structure shown in FIG. 15A will be described.

To begin with, an STI element isolation trench 60a is formed in a p-type silicon substrate 60 in which first and second peripheral circuit regions I and II and a cell region III are defined. A silicon oxide is formed as an element isolation insulating film 61 in the trench 60a. After that, the entire upper surface of the resultant silicon substrate 60 is thermally oxidized, thereby forming a thermally-oxidized film with a thickness of approximately 10 nm. The thermally-oxidized film is used as a sacrificial insulating film 59.

It should be noted that the second peripheral circuit region II of the silicon substrate 60 is further subdivided into a high-voltage transistor formation region $II_H$, a middle-voltage transistor formation region $II_M$, and a low-voltage transistor formation region $II_L$.

Subsequently, as shown in FIG. 15B, a first resist pattern 62 including a window 62a is formed the sacrificial insulating film 59. Through the window 62a, the cell region III and one portion where the n-type transistor is formed in the high-voltage transistor formation region $II_H$ are exposed to the outside. Through the window 62a first portion of the first peripheral circuit region I is also exposed to the outside. Then, through the window 62a, phosphorus ions, which are n-type impurities, are implanted in the resultant silicon substrate 60. Thus, a buried n-type diffusion layer 63 is formed in a deep portion of the resultant silicon substrate 60. Conditions for the ion implantation are not particularly limited, but the present embodiment employs the condition that acceleration energy is 2 MeV and that a dose amount is $2 \times 10^{13}$ cm$^{-2}$.

Thereafter, the first resist pattern 62 is removed.

Next, as shown in FIG. 15C, photo resist is applied onto the sacrificial insulating film 59, and a second resist pattern 58 is formed by exposing and developing the applied photo resist. The second resist pattern 58 includes a window 58a. Through the window 58, the cell region III and one portion where the n-type MOS transistor is formed in the high-voltage transistor formation region $II_H$ are exposed to the outside. One portion of the first peripheral circuit region I is also exposed to the outside through the window 58a.

In addition, in the second resist pattern 58, a window 58b is formed at the boundary between the high-voltage transistor formation region $II_H$ and the middle-voltage transistor formation region $II_M$. Moreover, another window, which is not shown, is also formed at the boundary between the high-voltage transistor formation region $II_H$ and the low-voltage transistor formation region $II_L$.

Then, while such a second resist pattern 58 is being used as a mask, boron ions, which are p-type impurities, are implanted twice in the resultant silicon substrate 60 respectively under the following conditions. The conditions for the first time are that acceleration energy is 400 KeV and that a dose amount is $5 \times 10^{13}$ cm$^{-2}$. The conditions for the second time are that acceleration energy is 100 KeV and that a dose amount is $2 \times 10^{12}$ cm$^{-2}$. Thus, first and second p-wells 64 and 65 are formed in deep portions of the resultant silicon substrate 60.

In the high-voltage transistor formation region $II_H$, an n-type MOS transistor with a high threshold voltage and an n-type MOS transistor with a low threshold voltage are formed. The latter threshold voltage is controlled by the above-described first p-well 64.

After that, the second resist pattern 58 is removed.

Subsequently, as shown in FIG. 15D, a third resist pattern 67 is formed in all the regions I to III. The third resist pattern 67 includes a window 67a on a portion where the n-type MOS transistor with a high threshold voltage is formed in the high-voltage transistor formation region $II_H$. The third resist pattern 67 also has a window 67b above the second p-well 65.

Then, while the third resist pattern 67 is being used as a mask, boron ions, which are p-type impurities, are implanted in the resultant silicon substrate 60 under the conditions that acceleration energy is 100 KeV and that a dose amount is $6 \times 10^{12}$ cm$^{-2}$. Third and fourth p-wells 68 and 69 are thus formed.

Among these wells, the third p-well 68 is to be used for controlling a threshold voltage of the n-type MOS transistor with a high threshold voltage, which will be formed later in the high-voltage transistor formation region $II_H$.

After that, the third resist pattern 67 is removed.

Next, as shown in FIG. 15E, a fourth resist pattern 71 is formed in all the regions I to III. The fourth resist pattern 71 has a window 71a on a portion which includes a place where p-type MOS transistors will be formed in the region $II_H$, and which also includes an end portion of the buried n-type diffusion layer 63

Then, while the fourth resist pattern 71 is being used as a mask, phosphorus ions, which are n-type impurities, are implanted twice in the resultant silicon substrate 60 respectively under the following conditions. The conditions for the first time are that acceleration energy is 600 KeV and that a dose amount is $5 \times 10^{13}$ cm$^{-2}$. The conditions for the second time are that acceleration energy is 240 KeV and that a dose amount is $3 \times 10^{12}$ cm$^{-1}$ Thus, a second n-well 72 is formed in a deep portion of the resultant silicon substrate 60.

Thereafter, the fourth resist pattern 71 is removed.

Next, as shown in FIG. 15F, a fifth resist pattern 75 having a window 75a is formed in all the regions I to III. The window 75a is located on a region where a p-type MOS transistor with a high threshold voltage will be formed in the high-voltage transistor formation region $II_H$.

Then, while the fifth resist pattern 75 is being used as a mask, phosphorus ions, which are n-type impurities, are implanted in the resultant silicon substrate 60 under the conditions that acceleration energy is 240 KeV and that a dose amount is $6.5 \times 10^{12}$ cm$^{-2}$. A third n-well 76 is thus formed.

The third n-well 76 is to be used for controlling a threshold voltage of the p-type MOS transistor with a high threshold, which will be formed later in the high-voltage transistor formation region $II_H$.

After that, the fifth resist pattern 75 is removed.

Subsequently, as shown in FIG. 15G, a sixth resist pattern 79 is formed in all the regions I to III. The sixth resist pattern 79 includes a window 79a on the first peripheral circuit region I and the cell region III. Then, while the sixth resist pattern 79 is being used as a mask, boron ions, which are p-type impurities, are implanted in the resultant silicon substrate 60 under the conditions that acceleration energy is 40 KeV and that a dose amount is $6 \times 10^{13}$ cm$^{-2}$. Thus, a first p-type impurity diffusion region 80 is formed. The first p-type impurity diffusion region 80 has a function to control a threshold voltage of a flash memory cell, which will be formed later in the cell region III.

Then, the sixth resist pattern 79 is removed.

Through the steps up to here, the formation of a plurality of high-voltage wells provided in the semiconductor device of the present embodiment has been completed. A voltage is individually applied to each of the wells through a well contact region, which is not shown.

Next, steps for obtaining a cross-sectional structure shown in FIG. 15H will be described.

Firstly, the sacrificial insulating film 59 is removed by wet etching using the HF solution, and thereby the clean surface of the resultant silicon substrate 60 is exposed to the outside. Then, a thermally-oxidized film is formed with a thickness of approximately 10 nm on the upper surface of the resultant silicon substrate 60 by heat treatment under the conduction that a substrate temperature is set at 900 to 1050° C. in an atmosphere in which Ar and $O_2$ are mixed. The thermally-oxidized film is used as a first insulating film 81. The insulating film 81 will be a tunnel insulating film of the flash memory cell later.

Next, steps for obtaining a cross-sectional structure shown in FIG. 15I will be described.

Firstly, by using the low pressure CVD method in which $SiH_4$ and $PH_3$ are used as reaction gases, a polysilicon film is formed with a thickness of approximately 90 nm on the first insulating film 81. The polysilicon film is doped in-situ with phosphorus, and is used as a first conductive film 82. Next, the first conductive film 82 is patterned by photolithography. Thereby, the first conductive film 82 is removed from the second peripheral circuit region II. Note that, by this patterning, each of the first conductive films 82 in the cell region III comes to have a strip-shape and intersects at right angles with the direction of word lines.

Subsequently, on the first conductive film 82 and on the first insulating film 81 in the second peripheral circuit region II, a silicon oxide film and a silicon nitride film are formed in this order respectively with approximately 5 nm and 10 nm, by using the low pressure CVD method. Moreover, in an $O_2$ atmosphere, the surface of the silicon nitride film is oxidized at a substrate temperature of approximately 950° C. A silicon oxide film is thus formed with a thickness of approximately 5 nm on the surface of the silicon nitride film. Thereby, an ONO film is formed by stacking the silicon oxide film, the silicon nitride film and the silicon oxide film in this order. The ONO film is formed on the entire surface as a second insulating film 83.

It should be noted that by the heat treatment for oxidizing the silicon nitride film in the ONO film and by the heat treatment for forming the first insulating film 81 described in FIG. 15H, approximately between 0.1 μm and 0.2 μm and more impurities in the wells formed in the silicon substrates 60 are diffused. Thereby, the impurity distribution of the wells becomes broad.

Next, as shown in FIG. 15J, a seventh resist pattern 84 is formed in all the regions I to III. The seventh resist pattern 84 includes windows 84a and 84b respectively on portions, in each of which an n-type transistors is formed, in the middle-voltage transistor formation region $II_M$ and the low-voltage transistor formation region $II_L$.

Then, while the seventh resist pattern 84 is being used as a mask and the first and second insulating films 81 and 83 are being used as through films, boron ions, which are p-type impurities, are implanted in the resultant silicon substrate 60 under the conditions that acceleration energy is 150 KeV and that a dose amount is $3\times10^{13}$ cm$^{-2}$. Thus, fifth and sixth p-wells 70 and 73 are formed in the regions $II_M$ and $II_L$, respectively.

Thereafter, the seventh resist pattern 84 is removed.

Next, as shown in FIG. 15K, an eighth resist pattern 86 is formed in all the regions I to III. The eighth resist pattern 86 includes windows 86a and 86b respectively on portions, in each of which a p-type MOS transistor is formed this time, in the regions $II_M$ and $II_L$. Furthermore, while the eighth resist pattern 86 is being used as a mask and the first and second insulating films 81 and 83 are being used as a through film, phosphorous ions, which are n-type impurities, are implanted in the resultant silicon substrate 60 under the conditions that acceleration energy is 360 KeV and that a dose amount is $3\times10^{13}$ cm$^{-2}$. Thus, fourth and fifth n-wells 77 and 78 are shallowly formed in the regions $II_M$ and $II_L$, respectively.

Then, the seventh resist pattern 84 is removed.

Next, steps for obtaining a cross-sectional structure shown in FIG. 15L will be described.

Firstly, second and third p-type impurity diffusion regions 85 and 89 and first and second n-type impurity diffusion regions 87 and 91 are formed in the resultant silicon substrate 60 by ion implantation. The impurity diffusion regions 85, 89, 87 and 89 are used for adjusting threshold voltages of the MOS transistors, respectively. Note that a resist pattern, which is not shown, is used for this ion implantation in order to selectively implant p-type impurities and n-type impurities.

Subsequently, the first and second insulating films 81 and 83 in the second peripheral circuit region II, which have been used as the through films for the ion implantation, are removed. In order to carry out this, as shown in FIG. 15L, a ninth resist pattern 92 covering the cell region III is formed on the second insulating film 83. The ninth resist pattern 92 does not cover a contact region CR of the first conductive film 82 in the first peripheral circuit region I and the second peripheral circuit region II, and thereby the contact region CR and the second peripheral circuit region II are exposed to the outside.

Next, while the ninth resist pattern 92 are being used as a mask, the second insulating film 83 on the contact region CR and the first and second insulating films 81 and 83 in the second peripheral circuit region II are removed by etching. This etching is performed firstly by plasma etching using the mixed gas of $CH_3$ and $O_2$ as an etching gas, and then by wet etching using the HF solution. Thereby, the second insulating film 83 is left only in the region other than the contact region CR of the first conductive film 82 in the first peripheral circuit region I and the cell region III. Concurrently, the resultant silicon substrate 60 in the second peripheral circuit region II is exposed to the outside.

Then, after the ninth resist pattern 92 is removed by oxygen ashing, the upper surface of the resultant silicon substrate 60 is cleaned by wet treatment.

Next, steps for obtaining a cross-sectional structure shown in FIG. 15M will be described.

Firstly, the upper surface of the resultant silicon substrate 60, which is exposed to the outside in the second peripheral circuit region II, is thermally oxidized up to a thickness of 13 nm, by employing the oxidation condition that a substrate temperature is 850° C. The thus formed thermally-oxidized film is called a third insulating film 94. In this thermal oxidation, a third insulating film 94 made of the thermally-oxidized film is also formed on the contact region CR of the first conductive film 82, which is exposed to the outside without being covered with the second insulating film 83.

Subsequently, a tenth resist pattern 93 is formed in the cell region III and the high-voltage transistor formation region $II_H$. Then, while the tenth resist pattern 93 is being used as a mask, the third insulating film 94 on the middle-voltage transistor formation region $II_M$ and the low-voltage transistor formation region $II_L$ is removed by etching in the wet etching method using the HF solution. In addition, in this etching, the third insulating film 94 made of the thermally-oxidized film on the contact region CR of the first conductive film 82 is also etched, and thereby the contact region CR is exposed to the outside.

After that, the tenth resist pattern 93 is removed.

Next, steps for obtaining a cross-sectional structure shown in FIG. 15N will be described.

Firstly, the upper surface of the resultant silicon substrate 60, which is exposed to the outside in the middle-voltage transistor formation region $II_M$ and the low-voltage transistor formation region $II_L$, is thermally oxidized up to a thickness of approximately 6 nm, by employing the oxidation condition that a substrate temperature is approximately 850° C. in an oxygen atmosphere. The thus formed thermally-oxidized film is called a fourth insulating film 96. The fourth insulating film 96 is also formed on the contact region CR of the first conductive film 82, as in the case of the previously-mentioned third insulating film 94.

Next, an eleventh resist pattern 95 is formed in the cell region III, the high-voltage transistor formation region $II_H$, and the middle-voltage transistor formation region II$_M$. Then, while the eleventh resist pattern 95 is being used as a mask, the wet etching is performed by using the HF solution. Thereby, the fourth insulating film 96 on the contact region CR and the low-voltage transistor formation region II$_L$ is removed by etching.

Thereafter, the eleventh resist pattern 95 is removed.

Next, steps for obtaining a cross-sectional structure shown in FIG. 15O will be described.

Firstly, silicon in portions uncovered with the second to fourth insulating films 83, 94 and 96 is thermally oxidized up to a thickness of approximately 2.2 nm, by employing the oxidation condition that a substrate temperature is approximately 850° C. in an oxygen atmosphere. Accordingly, a thermally-oxidized film with a thickness of approximately 2.2 nm is formed as a fifth insulating film 97 on each of the upper surface of the contact region CR of the first conductive film 82 made of polysilicon, and the upper surface of the resultant silicon substrate 60 in the low-voltage transistor formation region II$_L$. One of the fifth insulating films 97 is formed next to the second insulating film 83. Thus, these second and fifth insulating films 83 and 97 compose an insulator 99.

Note that, as a result of forming the fifth insulating film 97 by thermal oxidation, final thicknesses of the third and fourth insulating films 94 and 96 become 16 nm and 7 nm, respectively.

After that, by means of the low pressure CVD method using SiH$_4$ as a reaction gas, a non-doped polysilicon film with a thickness of approximately 180 nm is formed as a second conductive film 100 on the entire upper surface of the resultant silicon substrate 60.

Next, steps for obtaining a cross-sectional structure shown in FIG. 15P will be described.

Firstly, photoresist is applied onto the second conductive film 100, and a twelfth resist pattern 101 is formed by exposing and developing the applied photoresist. Then, the first and second insulating films 82 and 100 and the insulator 99 are patterned by using the twelfth resist pattern 101 as an etching mask. This patterning is carried out in a plasma etching chamber. A mixed gas of Cl$_2$ and O$_2$ is used as an etching gas for the first and second conductive films 82 and 100, which are made of polysilicon. A mixed gas of CH$_3$ and O$_2$ is used as an etching gas for the second insulating film 83, which is made of the ONO film composing the insulator 99.

As a result of such patterning, the first and second conductive films 82 and 100 on the first peripheral circuit region I respectively become a first and second conductors 82a and 100a. Moreover, the first and second conductive films 82 and 100 and the insulator 99 on the cell region III respectively become a floating gate 82d, a control gate 100d and an intermediate insulating film 99d. Meanwhile, the second conductive film 100 remains in the second peripheral circuit region II.

Thereafter, the twelfth resist pattern 101 is removed, as shown in FIG. 15Q.

Then, thermally-oxidized thin films (not shown) are formed on side surfaces respectively of the floating gate 82d and the control gate 100d, by thermally oxidizing these side surfaces. The thermally-oxidized films take a role of improving the retention property of a flash memory cell, which will be finally formed.

Next, steps for obtaining a cross-sectional structure shown in FIG. 15R will be described.

Firstly, an unillustrated resist pattern covering the second conductive film 100 is formed. By using the resist pattern as a mask, As$^+$ ions are implanted in the resultant silicon substrate 60 as n-type impurities. The conditions of the ion implantation are not particularly limited, but the present embodiment employs the conditions, for example, that acceleration energy is 50 KeV and that a dose amount is 6.0×10$^{14}$ cm$^{-3}$. As a result of such ion implantation, second n-type source/drain extension 102b is formed at a side of the first conductor 82a, and third and fourth n-type source/drain extensions 102c and 102d are formed at both sides the floating gate 82d.

After that, the above-described resist pattern is removed. The side surfaces of the floating gate 82d and the control gate 100d are thermally-oxidized again, and thus thermally-oxidized films, which are not shown, are formed.

Next, a silicon nitride film is formed on the entire upper surface. Then, the silicon nitride film is etched back. As a result, the silicon nitride films are left on side surfaces respectively of the second conductor 100a and the floating gate 82d as first insulating sidewalls 103.

Next, as shown in FIG. 15S, the second conductor 100a on the first peripheral circuit region I and the second conductive film 100 in the second peripheral circuit region II are patterned by photolithography. As a result, a part of the second conductor 100a is removed from the contact region CR, and thereby, a first opening 100b is formed. Concurrently, first to tenth gate electrodes 10e to 100n are formed in the second peripheral circuit region II. The first to tenth gate electrodes 10e to 100n are formed of the patterned second conductive film 100.

Subsequently, as shown in FIG. 15T, while the first to tenth gate electrodes 10e to 100n and an unillustrated resist pattern are being used as masks, n-type impurity ions such as As are implanted in the resultant silicon substrate 60. Thus, fifth to fourteenth n-type source/drain extensions 102e to 102n are formed as shown in FIG. 15T. Similarly, p-type impurity ions such as B are implanted in the resultant silicon substrate 60. Thereby, first to tenth p-type source/drain extensions 102p to 102y are formed as shown in FIG. 15T. Note that, selective implantation of the n-type impurity and p-type impurity in the above-described ion implantation is carried out by using resist patterns, which are not shown. The resist patterns are removed after the ion implantation is completed.

Next, steps for obtaining a cross-sectional structure shown in FIG. 15U will be described.

Firstly, a silicon oxide film is formed on the entire upper surface by using the CVD method. Then, the silicon oxide film is etched back, and thereby second insulating sidewalls 104 are formed on the sides surfaces respectively of the second conductor 100a, the control gate 100d, and the first to tenth gate electrodes 100e to 100n. Subsequently, after this etch-back process, over-etching is carried out. A second opening 99a is thus formed in the fifth insulating film 97. Concurrently, the third to fifth insulating films 94, 96 and 97, which are formed on unnecessary portions in the second peripheral circuit region II, are removed.

In addition, by this etch-back process, the first insulating film 81 is patterned by using the second insulating sidewalls 104 as masks. As a result, the patterned first insulating films 81 are left under the first conductor 82a and the floating gate 82d as a gate insulating film 81a and a tunnel insulating film 81b, respectively.

Furthermore, in the second peripheral circuit region II, the third to fifth insulating films 94, 96, and 97 are patterned by using the first to tenth gate electrodes 10e to 100n as masks. Thus, these insulating films are left respectively as gate insulating films 94a to 94d, 96a and 96b, and 97a to 97d.

Thereafter, first to fourteenth n-type source/drain regions 105a to 105n and first to tenth p-type source/drain regions 105p to 105y are formed. As shown in FIG. 15V, by ion implantation by using the second insulating sidewalls 104, the control gate 100d, and the first to tenth gate electrodes 100e to 100n as masks. The selective implantation of the n-type impurity and the p-type impurity in this ion implantation is carried out by using resist patterns, which are not shown. The resist patterns are removed after the ion implantation has been completed.

By the steps up to here, n-type MOS transistors $TR_n$(Low Vth) and $TR_n$(High Vth) and p-type MOS transistors $TR_p$ (Low Vth) and $TR_p$(high Vth) are formed in each of the high-voltage transistor formation region $II_H$ and the low-voltage transistor formation region $II_L$. The MOS transistors are used for configuring a logic circuit such as a sense amplifier. Each of the phrases, "Low Vth" and "High Vth" is given to each of the transistors, and the phrase shows whether a level of a threshold voltage of the transistor is high or low.

When a transistor with a high threshold voltage and a transistor with a low threshold voltage are mixed as described above, a circuit can be operated at high speed by using the MOS transistor with the low threshold voltage. In addition, a leak current generated during stand-by can be suppressed by keeping the MOS transistor with the low threshold voltage in an off-state, and by using the MOS transistor with the high threshold voltage, instead, at the stand-by time.

In addition, among the above-described MOS transistors, the transistor formed in the high-voltage transistor formation region $II_H$ is a high-voltage MOS transistor with a voltage of 5-10 V, which is applied to the gate electrode. Meanwhile, the transistor formed in the low-voltage transistor formation region $II_L$ is a low-voltage MOS transistor with a voltage of 1.2 V.

Then, an n-type MOS transistor $TR_n$ and a p-type MOS transistor TRP are formed in the middle-voltage transistor formation region $II_M$, as shown in FIG. 15U. In both transistors, voltages applied to the gate electrodes are 2.5V or 3.3V for I/O circuits.

On the other hand, a flash memory cell FL is formed in the cell region III. The flash memory cell FL is configured of the control gate 100d, the intermediate insulating film 99d, the floating gate 82d, the tunnel insulating film 81b, and the third and fourth n-type source/drain regions 105c and 105d.

In addition, although it is not clearly specified, the first conductor 82a extents on the silicon substrate 60, and configures a reference transistor together with the second n-type source/drain region 105b and the unillustrated first n-type source/drain region.

Next, steps for obtaining a cross-sectional structure shown in FIG. 15V will be described.

Firstly, a cobalt film is formed with a thickness of approximately 8 nm on the entire upper surface by using the sputtering method. Then, the cobalt film is annealed, thereby reacting with silicon. After that, an unreacted cobalt film on the element isolation insulating film 61 and the like is removed by wet etching. Thus, cobalt silicide layers 106b to 106y are formed in the upper surface layer of the resultant silicon substrate 60.

Next, a silicon nitride film is formed with a thickness of approximately 50 nm by using the CVD method. The silicon nitride film is called an etching stopper film 107. Then, a silicon oxide film is formed as a sixth insulating film 108 on the etching stopper film 107 by using the CVD method. Thus, the etching stopper film 107 and the sixth insulating film 108 compose a first interlayer insulating film 109. The sixth insulating film 108 has a thickness of approximately 1 µm on the planar surface on the resultant silicon substrate 60.

Subsequently, the upper surface of the first interlayer insulating film 109 is polished to be planarized by using the CMP method. After that, the first interlayer insulating film 109 is patterned by photolithography, whereby forming a first hole 109a and third to twenty-fifth holes 109c to 109y. Among these holes, the first hole 109a is positioned on the contact region CR of the first conductor 82a, and is formed inside the first and second openings 100b and 99a. In addition, the remaining third to twenty-fifth holes 100c to 100y are formed respectively on the cobalt silicide layers 106b to 106y.

Furthermore, a Ti film and a TiN film are formed in this order by using the sputtering method inside the first and third to twenty-fifth holes 109a and 100c to 100y and on the first interlayer insulating film 109. The Ti film and the TIN film are used as a glue film. Then, a W film is formed on the glue film by means of the CVD method using tungsten hexafluoride as a reaction gas. As a result, the insides of the first and third to twenty-fifth holes 109a and 100c to 100y are completely filled with the glue film and the W film. Subsequently, the excessive W film and glue film, which are formed on the first interlayer insulating film 109, are removed by using the CMP method. Concurrently, these films are left inside the first and third to twenty-fifth holes 109a, and 100c to 100y as first and third to twenty-fifth conductive plugs 110a and 110c to 110y.

Next, steps for obtaining a cross-sectional structure shown in FIG. 15W will be described.

Firstly, an applied type low permittivity insulating film 111 is formed on the entire upper surface. Then, a silicon oxide film is formed as a cover insulating film 112 on the low permittivity insulating film 111. The low permittivity insulating film 111 and the cover insulating film 112 compose a second interlayer insulating film 113.

Next, the second interlayer insulating film 113 is patterned by photolithography, thereby forming wiring trenches 113a.

After that, a Cu film is formed as a seed layer on the entire upper surface by using the sputtering method. Then, an electrolytic copper plating film is formed on the seed layer by feeding power to the seed layer. Subsequently, each of the wiring trenches 113a is completely filled with the copper plating film. After that, by using the CMP method, the excessive seed layer and copper plating film, which are formed on the second interlayer insulating film 113, are removed. Meanwhile, these films are left in each of the wiring trenches 113a as a copper interconnection 114.

As described above, a basic structure of the semiconductor device according to the present embodiment has been completed.

According to the present embodiment as described above, as shown in FIG. 15S, the second p-well 65 is deeply formed between the second n-well 72 and the fifth p-well 70. The second n-well 72 deeply formed in the p-type silicon substrate 60, and the fifth p-well 70 is shallowly formed therein. Accordingly, the deep second p-well 65 increases the impurity concentration of the base of the parasitic NPN bipolar transistor configured of the shallow fourth n-well 77, the p-type silicon substrate 60 and the deep second n-well 72. As a result, the current amplification factor of the NPN bipolar transistor is decreased. This makes it possible to prevent latch-up along the path R shown in FIG. 15S, and to provide a logic embedded flash memory with more enhanced reliability.

As described above, the embodiments of the present invention have been described in detail, but the present invention is not limited to the above-described embodiments. For example, in the first to fifth embodiments, a p-type substrate is used as a silicon substrate. Instead of this, however, an n-type silicon substrate can be used. In this case, a conductivity type of each well is the opposite type of that of the forgoing.

According to the present invention, the fourth well is deeply formed in the semiconductor substrate, thereby increasing the impurity concentration of the base of the parasitic bipolar transistor. This makes it possible to prevent the parasitic bipolar transistor from being powered on, thereby suppressing the latch-up from occurring.

What is claimed is:

1. A semiconductor device, comprising:
a semiconductor substrate of a first conductive type;
a first well of a second conductive type formed in the semiconductor substrate, where the second conductive type being opposite type of the first conductive type;
a second well of the first conductive type formed beside the first well in the semiconductor substrate; and
a third well of the second conductive type which is formed beside the second well in the semiconductor substrate, and which is deeper than the second well,
wherein a fourth well of the first conductive type deeper than the second well is formed between the second and third wells in the semiconductor substrate, the fourth well being in contact with the second well.

2. The semiconductor device according to claim 1, wherein the fourth well is also formed between the first and second wells in the semiconductor substrate.

3. The semiconductor device according to claim 2, wherein the first well is deeper than the second well.

4. The semiconductor device according to claim 1, wherein the fourth well is formed to surround the third well.

5. The semiconductor device according to claim 1, wherein:
a fifth well of the first conductive type is formed beside the first well in the semiconductor substrate; and
a MOS transistor with a CMOS structure is formed in each of the first and fifth wells.

6. The semiconductor device according to claim 1, wherein:
an isolation well of the first conductive type and a sixth well of the second conductive type are formed side-by-side beside the third well in the semiconductor substrate; and
the third and sixth wells are isolated from each other by the isolation well.

7. The semiconductor device according to claim 1, wherein first to third MOS transistors are formed respectively in the first to third wells.

8. The semiconductor device according to claim 1, wherein a flash memory cell is formed in the semiconductor substrate.

9. A semiconductor device, comprising:
a semiconductor substrate of a first conductive type;
a first well of a second conductive type formed in the semiconductor substrate, where the second conductive type being opposite type of the first conductive type;
a second well of the first conductive type formed beside the first well in the semiconductor substrate; and
a third well of the second conductive type which is formed beside the second well in the semiconductor substrate, and which is deeper than the second well, wherein:
a fourth well of the first conductive type deeper than the second well is formed between the second and third wells in the semiconductor substrate; the fourth well being in contact with the second well, and
an absolute value of a voltage applied to the third well is larger than any one of an absolute value of voltages applied to the first well and an absolute value of voltages applied to the second well.

10. The semiconductor device according to claim 9, wherein the fourth well is also formed between the first and second wells in the semiconductor substrate.

11. The semiconductor device according to claim 9, wherein the first well is deeper than the second well.

12. The semiconductor device according to claim 9, wherein the fourth well is formed to surrounds the third well.

13. The semiconductor device according to claim 9, wherein:
first to third MOS transistors are formed respectively in the first to third wells; and
an operating voltage of the third MOS transistor is higher than any one of an operating voltage of the first MOS transistor and an operating voltage of the second MOS transistor.

14. The semiconductor device according to claim 9, wherein a flash memory cell is formed in the semiconductor substrate.

15. A method of manufacturing a semiconductor device, comprising:
forming a first well of a second conductive type in a semiconductor substrate of a first conductive type, where the second conductive type being opposite type of the first conductive type;
forming a second well of the first conductive type beside the first well in the semiconductor substrate;
forming a third well of the second conductive type deeper than the second well beside the second well in the semiconductor substrate; and
forming a fourth well of the first conductive type deeper than the second well between the second and third wells in the semiconductor substrate, the fourth well being in contact with the second well.

16. The method of manufacturing a semiconductor device according to claim 15, wherein, when forming the fourth well, the fourth well is formed in a planar shape which is obtained by enlarging an outline of the third well to surround the third well.

17. The method of manufacturing a semiconductor device according to the claim 15, further comprising:
forming a fifth well of the first conductive type beside the first well in the semiconductor substrate in the step of forming the fourth well; and
forming a MOS transistor with a CMOS structure in each of the first and fifth wells.

18. The method of manufacturing a semiconductor device according to claim 15, further comprising:
forming a sixth well of the second conductive type in the semiconductor substrate,
wherein, when forming the fourth well, an isolation well of the first conductive type is formed between the third and sixth wells in the semiconductor substrate, and the third and sixth wells are isolated from each other by the isolation well.

19. The method of manufacturing a semiconductor device according to claim 15, further comprising:
forming first to third MOS transistors respectively in the first to third wells.

20. The method of manufacturing a semiconductor device according to claim 15, further comprising:
forming a flash memory cell in the semiconductor substrate.

21. A semiconductor device, comprising:
a semiconductor substrate of a first conductive type;
a first well of a second conductive type formed in the semiconductor substrate, where the second conductive type being opposite type of the first conductive type;

a second well of the first conductive type formed in the semiconductor substrate, the second well being formed beside the first well and neighboring the first well; and a third well of the second conductive type which is formed in the semiconductor substrate and neighboring the second well, and which is deeper than the second well, wherein a fourth well of the first conductive type deeper than the second well is formed between the second and third wells in the semiconductor substrate, the fourth well neighboring the second well.

22. A semiconductor device, comprising:

a semiconductor substrate of a first conductive type;

a first well of a second conductive type formed in the semiconductor substrate, where the second conductive type being opposite type of the first conductive type;

a second well of the first conductive type formed in the semiconductor substrate, the second well being formed beside the first well and neighboring the first well; and a third well of the second conductive type which is formed in the semiconductor substrate and neighboring the second well, and which is deeper than the second well, wherein:

a fourth well of the first conductive type deeper than the second well is formed between the second and third wells in the semiconductor substrate; the fourth well neighboring the second well, and an absolute value of a voltage applied to the third well is larger than any one of an absolute value of voltages applied to the first well and an absolute value of voltages applied to the second well.

23. A method of manufacturing a semiconductor device, comprising:

forming a first well of a second conductive type in a semiconductor substrate of a first conductive type, where the second conductive type being opposite type of the first conductive type;

forming a second well of the first conductive type in the semiconductor substrate, the second well being formed beside the first well and neighboring the first well;

forming a third well of the second conductive type deeper than the second well in the semiconductor substrate, the third well neighboring the second well; and forming a fourth well of the first conductive type deeper than the second well between the second and third wells in the semiconductor substrate, the fourth well neighboring the second well.

\* \* \* \* \*